(12) United States Patent
Derkacs

(10) Patent No.: US 10,270,000 B2
(45) Date of Patent: *Apr. 23, 2019

(54) MULTIJUNCTION METAMORPHIC SOLAR CELL ASSEMBLY FOR SPACE APPLICATIONS

(71) Applicant: SolAero Technologies Corp., Albuquerque, NM (US)

(72) Inventor: Daniel Derkacs, Albuquerque, NM (US)

(73) Assignee: SolAero Technologies Corp., Albuquerque, NM (US)

(*) Notice: Subject to any disclaimer, the term of this patent is extended or adjusted under 35 U.S.C. 154(b) by 125 days.

This patent is subject to a terminal disclaimer.

(21) Appl. No.: 15/250,643

(22) Filed: Aug. 29, 2016

(65) Prior Publication Data

US 2017/0110614 A1  Apr. 20, 2017

Related U.S. Application Data

(60) Provisional application No. 62/288,181, filed on Jan. 28, 2016, provisional application No. 62/243,239, filed on Oct. 19, 2015.

(51) Int. Cl.
*H01L 31/0725* (2012.01)
*H01L 31/0735* (2012.01)
(Continued)

(52) U.S. Cl.
CPC .... *H01L 31/0725* (2013.01); *H01L 31/02008* (2013.01); *H01L 31/03046* (2013.01);
(Continued)

(58) Field of Classification Search
None
See application file for complete search history.

(56) References Cited

U.S. PATENT DOCUMENTS 4,001,864 A  1/1977  Gibbons
4,255,211 A  3/1981  Fraas
(Continued)

FOREIGN PATENT DOCUMENTS

CN  103426965 A  12/2013
DE  20 2012 104 415 U1  2/2013
(Continued)

OTHER PUBLICATIONS

Search Report and Opinion dated Mar. 29, 2017 for European Patent Application No. 16194187.7, 10 pages.
(Continued)

*Primary Examiner* — Devina Pillay

(57) ABSTRACT

A multijunction solar cell and its method of manufacture including interconnected first and second discrete semiconductor regions disposed adjacent and parallel to each other in a single semiconductor body, including first top subcell, second (and possibly third) lattice matched middle subcells; a graded interlayer adjacent to the last middle solar subcell; and a bottom solar subcell adjacent to said graded interlayer being lattice mismatched with respect to the last middle solar subcell; wherein the interconnected regions form at least a four junction solar cell by a series connection being formed between the bottom solar subcell in the first semiconductor region and the bottom solar subcell in the second semiconductor region.

19 Claims, 9 Drawing Sheets

(51) Int. Cl.
  *H01L 31/054* (2014.01)
  *H01L 31/18* (2006.01)
  *H01L 31/02* (2006.01)
  *H01L 31/0304* (2006.01)
  *H01L 31/05* (2014.01)
  *H01L 31/0687* (2012.01)
  *H01L 31/078* (2012.01)

(52) U.S. Cl.
  CPC ...... *H01L 31/0504* (2013.01); *H01L 31/0547* (2014.12); *H01L 31/0687* (2013.01); *H01L 31/078* (2013.01); *H01L 31/0735* (2013.01); *H01L 31/1844* (2013.01); *Y02E 10/544* (2013.01)

(56) References Cited

U.S. PATENT DOCUMENTS

| | | |
|---|---|---|
| 4,338,480 A | 7/1982 | Antypas et al. |
| 4,612,408 A | 9/1986 | Moddel et al. |
| 5,019,177 A | 5/1991 | Wanlass |
| 5,053,083 A | 10/1991 | Sinton |
| 5,217,539 A | 6/1993 | Fraas et al. |
| 5,322,572 A | 6/1994 | Wanlass |
| 5,342,453 A | 8/1994 | Olson |
| 5,376,185 A | 12/1994 | Wanlass |
| 5,479,032 A | 12/1995 | Forrest et al. |
| 5,828,088 A | 10/1998 | Mauk |
| 5,944,913 A | 8/1999 | Hou et al. |
| 6,180,432 B1 | 1/2001 | Freeouf |
| 6,239,354 B1 | 5/2001 | Wanlass |
| 6,252,287 B1 | 6/2001 | Kurtz et al. |
| 6,281,426 B1 | 8/2001 | Olson et al. |
| 6,300,557 B1 | 10/2001 | Wanlass |
| 6,300,558 B1 | 10/2001 | Takamoto et al. |
| 6,340,788 B1 | 1/2002 | King et al. |
| 6,482,672 B1 | 11/2002 | Hoffman et al. |
| 6,618,410 B1 | 9/2003 | Fischer et al. |
| 6,660,928 B1 | 12/2003 | Patton et al. |
| 6,815,736 B2 | 11/2004 | Mascarenhas |
| 6,951,819 B2 | 10/2005 | Iles et al. |
| 7,071,407 B2 | 7/2006 | Faterni et al. |
| 7,741,146 B2 | 6/2010 | Cornfeld et al. |
| 7,767,480 B1 | 8/2010 | Pickrell et al. |
| 7,785,989 B2 | 8/2010 | Sharps et al. |
| 7,960,201 B2 | 6/2011 | Cornfeld et al. |
| 8,236,600 B2 | 8/2012 | Cornfeld |
| 8,263,853 B2 | 9/2012 | Varghese |
| 8,969,712 B2 | 3/2015 | Newman et al. |
| 9,018,521 B1 | 4/2015 | Cornfeld |
| 9,252,313 B2 | 2/2016 | Meusel et al. |
| 2001/0018924 A1 | 9/2001 | Hisamatsu et al. |
| 2002/0117675 A1 | 8/2002 | Mascarenhas |
| 2003/0089392 A1 | 5/2003 | Rohr et al. |
| 2004/0166681 A1 | 8/2004 | Iles et al. |
| 2004/0200523 A1 | 10/2004 | King et al. |
| 2005/0155641 A1 | 7/2005 | Fafard |
| 2005/0247339 A1 | 11/2005 | Barnham et al. |
| 2005/0274411 A1 | 12/2005 | King et al. |
| 2006/0021565 A1 | 2/2006 | Zahler et al. |
| 2006/0144435 A1 | 7/2006 | Wanlass |
| 2006/0162768 A1 | 7/2006 | Wanlass et al. |
| 2007/0113887 A1 | 5/2007 | Laih et al. |
| 2007/0218649 A1 | 9/2007 | Hernandez |
| 2007/0277873 A1 | 12/2007 | Cornfeld et al. |
| 2008/0029151 A1 | 2/2008 | McGlynn et al. |
| 2008/0149173 A1 | 6/2008 | Sharps |
| 2008/0163920 A1 | 7/2008 | Meusel et al. |
| 2008/0185038 A1 | 8/2008 | Sharps |
| 2008/0245409 A1 | 10/2008 | Varghese et al. |
| 2009/0038679 A1 | 2/2009 | Varghese et al. |
| 2009/0078308 A1 | 3/2009 | Varghese et al. |
| 2009/0078309 A1 | 3/2009 | Cornfeld et al. |
| 2009/0078310 A1 | 3/2009 | Stan et al. |
| 2009/0078311 A1 | 3/2009 | Stan et al. |
| 2009/0155952 A1 | 6/2009 | Stan et al. |
| 2009/0229658 A1 | 9/2009 | Stan et al. |
| 2009/0229662 A1 | 9/2009 | Stan et al. |
| 2009/0272430 A1 | 11/2009 | Cornfeld et al. |
| 2009/0272438 A1 | 11/2009 | Cornfeld |
| 2009/0288703 A1 | 11/2009 | Stan et al. |
| 2010/0012174 A1 | 1/2010 | Varghese et al. |
| 2010/0012175 A1 | 1/2010 | Vraghese et al. |
| 2010/0147366 A1 | 6/2010 | Stan et al. |
| 2010/0186804 A1 | 7/2010 | Cornfeld |
| 2010/0203730 A1 | 8/2010 | Cornfeld et al. |
| 2010/0206365 A1 | 8/2010 | Chumney et al. |
| 2010/0229913 A1 | 9/2010 | Cornfeld |
| 2011/0011983 A1 | 1/2011 | King et al. |
| 2012/0015469 A1* | 1/2012 | Wanlass ............ H01L 31/06875 438/57 |
| 2012/0042937 A1 | 2/2012 | Wagner |
| 2014/0190559 A1 | 7/2014 | Meusel et al. |
| 2014/0261628 A1 | 9/2014 | Meitl et al. |
| 2015/0090321 A1 | 4/2015 | Cho et al. |
| 2016/0181464 A1 | 6/2016 | Cornfeld |

FOREIGN PATENT DOCUMENTS

| | | |
|---|---|---|
| DE | 10 2012 004 734 A1 | 9/2013 |
| EP | 0848433 A2 | 6/1998 |
| FR | 2 878 076 A1 | 5/2006 |
| WO | WO 2006/072423 A1 | 7/2006 |
| WO | WO 2013/074530 A2 | 5/2013 |
| WO | WO 2013/132073 A2 | 9/2013 |

OTHER PUBLICATIONS

Fraas, Lewis, James Avery, and David Scheiman. "AM0 calibration of 34% efficient mechanically stacked GaInP/GaAsGaSb circuits." Photovoltaic Specialists Conference, 2002. Conference Record of the Twenty-Ninth IEEE. IEEE, 2002.
King, Richard R., et al. "Group-IV Subcells in Multijunction Concentrator Solar Cells." Meeting Abstracts. No. 43. The Electrochemical Society, 2012.
U.S. Appl. No. 13/872,663, filed Apr. 29, 2013, Stan et al.
U.S. Appl. No. 14/828,206, filed Aug. 17, 2015, Derkacs.
Brown et al., "Results of the Telstar Radiation Experiments," Bell System Technical Journal, 42, 1505-1559, 1963.
Law et al., "Future Technology Pathways of Terrestrial III-V Multijunction Solar Cells for Concentrator Photovoltaic Systems," *Solar Energy Materials and Solar Cells*, 2010; 94:1314-1318.
Marvin, Assessment of Multijunction Solar Cell Performance in Radiation Environments, Aerospace Report No. TOR-2000 (1210)-1, 2000; 90 pages.
Patel et al., "Experimental Results From Performance Improvement and Radiation Hardening of Inverted Metamorphic Multijunction Solar Cells," *IEEE Journal of Photovoltaics*, Jul. 2012; 2(3):377-381.
Tada et al., Solar Cell Radiation Handbook, Third Edition, JPL Publication 82-69, 1982; cover page, face page and Table of Contents; 7 pgs.

* cited by examiner

MULTIJUNCTION METAMORPHIC SOLAR CELL ASSEMBLY FOR SPACE APPLICATIONS

REFERENCE TO RELATED APPLICATIONS

This application claims the benefit of U.S. Provisional Application No. 62/288,181 filed Jan. 28, 2016, and U.S. Provisional Patent Application Ser. No. 62/243,239 filed Oct. 19, 2015.

This application is related to co-pending U.S. patent application Ser. Nos. 14/828,197 and 14/828,206 filed Aug. 17, 2015; Ser. No. 15/210,532 filed Jul. 14, 2016; and Ser. No. 15/213,594 filed Jul. 19, 2016, and Ser. No. 15/250,673 filed Aug. 29, 2016.

This application is also related to co-pending U.S. patent application Ser. No. 14/660,092 filed Mar. 17, 2015, which is a division of U.S. patent application Ser. No. 12/716,814 filed Mar. 3, 2010, now U.S. Pat. No. 9,018,521; which was a continuation in part of U.S. patent application Ser. No. 12/337,043 filed Dec. 17, 2008.

This application is also related to co-pending U.S. patent application Ser. No. 13/872,663 filed Apr. 29, 2012, which was also a continuation-in-part of application Ser. No. 12/337,043, filed Dec. 17, 2008.

All of the above related applications are incorporated herein by reference in their entirety.

BACKGROUND OF THE INVENTION

Field of the Invention

The present disclosure relates to solar cells and the fabrication of solar cells, and more particularly the design and specification of a multijunction solar cell using electrically coupled but spatially separated semiconductor regions in a semiconductor body based on III-V semiconductor compounds.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to properly specify and manufacture. Typical commercial III-V compound semiconductor multijunction solar cells have energy efficiencies that exceed 27% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, and applications anticipated for five, ten, twenty or more years, the power-to-weight ratio and lifetime efficiency of a solar cell becomes increasingly more important, and there is increasing interest not only the amount of power provided at initial deployment, but over the entire service life of the satellite system, or in terms of a design specification, the amount of power provided at the "end of life" (EOL).

The efficiency of energy conversion, which converts solar energy (or photons) to electrical energy, depends on various factors such as the design of solar cell structures, the choice of semiconductor materials, and the thickness of each subcell. In short, the energy conversion efficiency for each solar cell is dependent on the optimum utilization of the available sunlight across the solar spectrum as well as the "age" of the solar cell, i.e. the length of time it has been deployed and subject to degradation associated with the temperature and radiation in the deployed space environment. As such, the characteristic of sunlight absorption in semiconductor material, also known as photovoltaic properties, is critical to determine the most efficient semiconductor to achieve the optimum energy conversion to meet customer requirements of intended orbit and lifetime.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The individual solar cells or wafers are then disposed in horizontal arrays or panels, with the individual solar cells connected together in an electrical series and/or parallel circuit. The shape and structure of an array, as well as the number of cells it contains, are determined in part by the desired output voltage and current.

The energy conversion efficiency of multijunction solar cells is affected by such factors as the number of subcells, the thickness of each subcell, the composition and doping of each active layer in a subcell, and the consequential band structure, electron energy levels, conduction, and absorption of each subcell, as well as its exposure to radiation in the ambient environment over time. Factors such as the short circuit current density ($J_{sc}$), the open circuit voltage ($V_{oc}$), and the fill factor are thereby affected and are also important. Another parameter of consideration taught by the present disclosure is the difference between the band gap and the open circuit voltage, or ($E_g/q-V_{oc}$), of a particular active layer, and such parameters may vary depending on subcell layer thicknesses, doping, the composition of adjacent layers (such as tunnel diodes), and even the specific wafer being examined from a set of wafers processed on a single supporting platter in a reactor run. Such factors also over time (i.e. during the operational life of the system). Accordingly, such parameters are NOT simple "result effective" variables (as discussed and emphasized below) to those skilled in the art confronted with complex design specifications and practical operational considerations.

One of the important mechanical or structural considerations in the choice of semiconductor layers for a solar cell is the desirability of the adjacent layers of semiconductor materials in the solar cell, i.e. each layer of crystalline semiconductor material that is deposited and grown to form a solar subcell, have similar crystal lattice constants or parameters. The present application is directed to solar cells with several substantially lattice matched subcells, but including at least one subcell which is lattice mismatched, and in a particular embodiment to a five junction (5J) solar cell using electrically coupled but spatially separated four junction (4J) semiconductor devices in a single semiconductor body.

SUMMARY OF THE DISCLOSURE

Objects of the Disclosure

It is an object of the present disclosure to provide increased photoconversion efficiency in a multijunction solar cell for space applications over the operational life of the photovoltaic power system.

It is another object of the present disclosure to provide in a multijunction solar cell in which the selection of the composition of the subcells and their band gaps maximizes the efficiency of the solar cell at a predetermined high temperature (in the range of 40 to 100 degrees Centigrade) in deployment in space at AM0 at a predetermined time after the initial deployment, such time being at least one year, and in the range of one to twenty-five years.

It is another object of the present disclosure to provide a four junction solar cell subassembly in which the average band gap of all four cells in the subassembly is greater than 1.44 eV, and to couple the subassembly in electrical series with at least one additional subcell in an adjacent solar cell subassembly.

It is another object of the present disclosure to provide a lattice mis-matched five junction solar cell in which the bottom subcell is intentionally designed to have a short circuit current that is substantially greater than current through the top three subcells when measured at the "beginning-of-life" or time of initial deployment.

It is another object of the present disclosure to provide a five-junction (5J) solar assembly assembled from two four-junction (4J) solar cell subassemblies in an integrated semiconductor structure so that the total current provided by the two subassemblies matches the total current handling capability of the bottom subcell of the assembly.

It is another object of the present disclosure to match the larger short circuit current of the bottom subcell of the solar cell assembly with two or three parallel stacks of solar subcells, i.e. a configuration in which the value of the short circuit current of the bottom subcell is at least twice, or at least three times, that of the solar subcells in each parallel stack which are connected in a series with the bottom subcell. Stated another way, given the choice of the composition of the bottom subcell, and there by the short circuit current of the bottom subcell, it is an object of the disclosure that the upper subcell stack be specified and designed to have a short circuit which is one-half or less than that of the bottom subcell.

Some implementations of the present disclosure may incorporate or implement fewer of the aspects and features noted in the foregoing objects.

Features of the Invention

The present application is directed to solar cells with several substantially lattice matched subcells, but in some embodiments including at least one subcell which is lattice mismatched, and in a particular embodiment to a five junction (5J) solar cell using electrically coupled but spatially separated four junction (4J) semiconductor regions in a semiconductor body based on III-V semiconductor compounds.

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 2.0, or 1.3 to 1.4, or 1.5 to 1.9 eV.

Briefly, and in general terms, the present disclosure describes solar cells that include a solar cell assembly of two or more solar cell subassemblies in a single monolithic semiconductor body composed of a tandem stack of solar subcells, where the subassemblies are interconnected electrically to one another.

As described in greater detail, the present application discloses that interconnecting two or more spatially split multijunction solar cell regions or subassemblies can be advantageous. The spatial split can be provided for multiple solar cell subassemblies monolithically formed on a single substrate and remaining as a monolithic semiconductor body with distinct characteristics. Alternatively, the solar cell subassemblies can be physically separated or fabricated individually as separate semiconductor chips that can be coupled together electrically. (Such alternative embodiments are covered in parallel applications, such as Ser. No. 15/213,594, noted in the Reference to Related Applications).

One advantage of interconnecting two or more spatially split multijunction solar cell subassemblies is that such an arrangement can allow accumulation of the current from the upper subcells in the adjacent semiconductor bodies into the bottom subcells which have higher current generation ability.

One advantage of interconnecting two or more spatially split multijunction solar cell subassemblies is that such an arrangement can allow the bottom subcells of different subassemblies to be connected in electrical series, this boosting the maximum operational voltage and open circuit voltage associated with the solar cell assembly, and thereby improving efficiency.

Further, selection of relatively high band gap semiconductor materials for the top subcells can provide for increased photoconversion efficiency in a multijunction solar cell for outer space or other applications over the operational life of the photovoltaic power system. For example, increased photoconversion efficiency at a predetermined time (measured in terms of five, ten, fifteen or more years) after initial deployment of the solar cell can be achieved.

Thus, in one aspect, a monolithic solar cell subassembly includes a first semiconductor body including an upper first solar subcell composed of (aluminum) indium gallium phosphide ((Al)InGaP); a second solar subcell disposed adjacent to and lattice matched to said upper first subcell, the second solar subcell composed of (aluminum) (indium) gallium arsenide ((Al)(In)GaAs) or indium gallium arsenide phosphide (InGaAsP); and a bottom subcell lattice matched to said second subcell and composed of (indium) gallium arsenide (In)GaAs.

The aluminum (or Al) constituent element, or indium (or In), shown in parenthesis in the preceding formula means that Al or In (as the case may be) is an optional constituent, and in the case of Al, in this instance may be used in an amount ranging from 0% to 40% by mole fraction. In some embodiments, the amount of aluminum may be between 20% and 30%. The subcells are configured so that the current density of the upper first subcell and the second subcell have a substantially equal predetermined first value, and the current density of the bottom subcell is at least twice that of the predetermined first value.

Briefly, and in general terms, the present disclosure provides a five junction solar cell comprising a semiconductor body including:

(a) a first semiconductor region including:
an upper first solar subcell composed of a semiconductor material having a first band gap, and including a top contact on the top surface thereof;
a second solar subcell adjacent to said first solar subcell and composed of a semiconductor material having a second band gap smaller than the first band gap and being lattice matched with the upper first solar subcell;
a third solar subcell adjacent to said second solar subcell and composed of a semiconductor material having a third band gap smaller than the second band gap and being lattice matched with the second solar subcell;
an interlayer adjacent to said third solar subcell, said interlayer having a fourth band gap or band gaps greater than said third band gap; and
a fourth solar subcell adjacent to said interlayer and composed of a semiconductor material having a fifth band gap smaller than the fourth band gap and being lattice mismatched with the third solar subcell, and including a first contact on the top surface thereof, and a second contact on the bottom surface thereof;

(b) a second semiconductor region disposed adjacent and parallel to the first semiconductor region and including:
an upper first solar subcell composed of a semiconductor material having a first band gap, and including a top contact on the top surface thereof;
a second solar subcell adjacent to said first solar subcell and composed of a semiconductor material having a second band gap smaller than the first band gap and being lattice matched with the upper first solar subcell;
a third solar subcell adjacent to said second solar subcell and composed of a semiconductor material having a third band gap smaller than the second band gap and being lattice matched with the second solar subcell and having a bottom contact;
an interlayer adjacent to said third solar subcell, said interlayer having a fourth band gap greater than said third band gap; and
a fourth solar subcell adjacent to said interlayer and composed of a semiconductor material having a fifth band gap smaller than the fourth band gap and being lattice mismatched with the third solar subcell, and including a first contact on the top surface thereof, and a second contact on the bottom surface thereof connected to the terminal of a second polarity;

(c) wherein the top contact of the first semiconductor region is electrically coupled with the top contact of the second semiconductor region and to a terminal of first polarity;
wherein the first contact on the top surface of the fourth solar subcell of the first semiconductor region is electrically coupled with the bottom contact of the third solar subcell of the second semiconductor region; and
the second contact on the bottom surface of the fourth solar subcell of the first semiconductor region is electrically coupled with the first contact on the top surface of the fourth solar subcell of the second semiconductor region thereof so as to form a five junction solar cell.

In some embodiments, the interlayer in each of the first and second semiconductor region is compositionally graded to substantially lattice match the upper solar subcell on one side and the adjacent lower solar subcell on the other side, and is composed of any of the As, P, N, Sb based III-V compound semiconductors subject to the constraints of having the in-plane lattice parameter less than or equal to that of the third solar subcell on the first surface and greater than or equal to that of the lower fourth solar subcell on the other opposing surface.

In some embodiments, the interlayer in each of the first and second semiconductor bodies is compositionally graded to substantially lattice match the third solar subcell on one side and the lower fourth solar subcell on the other side, and is composed of $(In_xGa_{1-x})Al_{1-y}As_y$, $In_xGa_{1-x}P$, or $(Al)In_xGa_{1-x}As$ compound semiconductors subject to the constraints of having the in-plane lattice parameter less than or equal to that of the third solar subcell and greater than or equal to that of the lower fourth solar subcell.

In some embodiments, the fourth subcell has a band gap of approximately 0.67 eV, the third subcell has a band gap in the range of 1.41 eV and 1.31 eV, the second subcell has a band gap in the range of 1.65 to 1.8 eV and the upper first subcell has a band gap in the range of 2.0 to 2.20 eV.

In some embodiments, the third subcell has a band gap of approximately 1.37 eV, the second subcell has a band gap of approximately 1.73 eV and the upper first subcell has a band gap of approximately 2.10 eV.

In some embodiments, the upper first subcell is composed of indium gallium aluminum phosphide; the second solar subcell includes an emitter layer composed of indium gallium phosphide or aluminum gallium arsenide, and a base layer composed of aluminum gallium arsenide; the third solar subcell is composed of indium gallium arsenide; the fourth subcell is composed of germanium or InGaAs, GaAsSb, InAsP, InAlAs, or SiGeSn, InGaAsN, InGaAsNSb, InGaAsNBi, InGaAsNSbBi, InGaSbN, InGaBiN, InGaSbBiN, and the graded interlayer is composed of $(Al)In_xGa_{1-x}As$ or $In_xGa_{1-x}P$ with $0<x<1$, and (Al) denotes that aluminum is an optional constituent.

In some embodiments, the upper first solar subcell, the second solar subcell, the third solar subcell, and the interlayer in the first and second semiconductor region form an integral monolithic semiconductor body. The semiconductor regions are "parallel" to each other in that the regions are disposed adjacent and parallel to one another so that the incoming light illuminates both the upper first solar subcell of the first semiconductor region and the first solar subcell of the second semiconductor region, and that parallel light beams traverses the stack of subcells of the entire semiconductor body.

In some embodiments, the first and second semiconductor region constitute a single semiconductor body that has been etched from the backside so that the substrate is separated into two spatially separated interconnected regions.

In some embodiments, the band gap of the interlayer is in the range of 1.41 eV to 1.6 eV throughout its thickness.

In some embodiments, the first and second semiconductor regions constitute a single semiconductor body that has been isolated to form two spatially separated and electrically interconnected solar cell subassemblies.

In some embodiments, the respective selection of the composition, band gaps, open circuit voltage, and short circuit current of each of the subcells (i) maximizes the efficiency of the assembly at high temperature (in the range of 40 to 100 degrees Centigrade) in deployment in space at a predetermined time after the initial deployment (referred to as the "beginning of life" or BOL), such predetermined time being referred to as the "end-of-life" (EOL), wherein such predetermined time is in the range of one to twenty-five years; or (ii) maximizes the efficiency of the solar cell at a predetermined low intensity (less than 0.1 suns) and low temperature value (less than minus 80 degrees Centigrade) in deployment in space at a predetermined time after the initial deployment in space, or the "beginning of life" (BOL), such predetermined time being referred to as the "end-of-life" (EOL) time, and being at least one year.

In some embodiments, the amount of aluminum in the upper first subcell is at least 10% by mole fraction.

In some embodiments, the semiconductor body further comprises a first highly doped lateral conduction layer disposed adjacent to and above the fourth solar subcell and a blocking p-n diode or insulating layer disposed adjacent to and above the first highly doped lateral conduction layer.

In some embodiments, the semiconductor body further comprises a second highly doped lateral conduction layer disposed adjacent to and above the blocking p-n diode or insulating layer.

In some embodiments, there further comprises a first alpha layer disposed above the second lateral conduction layer and having a different composition and a thickness of between 0.25 and 1.0 microns and functioning to prevent threading dislocations from propagating, either opposite to the direction of growth or in the direction of growth into the second subcell.

In some embodiments, the short circuit current density ($J_{sc}$) of the first, second and third middle subcells are approximately 11 mA/cm$^2$, and the short circuit current density ($J_{sc}$) of the bottom subcell is approximately 34 mA/cm$^2$.

In some embodiments, the short circuit density ($J_{sc}$) of the bottom subcell is at least three times that of the first, second and third subcells, with the base region of such subcell having a gradation in doping that increases from the base-emitter junction to the bottom of the base region in the range of $1 \times 10^{15}$ to $5 \times 10^{18}$ per cubic centimeter.

In another aspect, the present disclosure provides a multijunction solar cell including a terminal of first polarity and a terminal of second polarity comprising first and second semiconductor regions in a single semiconductor body, each region including substantially identical tandem vertical stacks of at least an upper first and a second bottom solar subcell in which the second semiconductor region is disposed adjacent to and with respect to the incoming illumination, parallel to the first semiconductor region; a bottom contact on the bottom subcell of the second semiconductor region connected to the terminal of second polarity; a top electric contact on both the upper first subcells of the first and second semiconductor regions electrically connected to the top electrical contacts to the terminal of first polarity; and an electrical interconnect connecting the bottom second subcell of the first semiconductor region in a series electrical circuit with the bottom second subcell of the second semiconductor region so that at least a three junction solar cell is formed by the electrically interconnected semiconductor regions.

In another aspect, the present disclosure provides a method comprising:

(a) growing a sequence of semiconductor layers on a substrate forming a semiconductor body, the sequence of layers including an upper first solar subcell composed of a semiconductor material having a first band gap, and including a top contact region on the top surface thereof;

a second solar subcell adjacent to said first solar subcell and composed of a semiconductor material having a second band gap smaller than the first band gap and being lattice matched with the upper first solar subcell;

a third solar subcell adjacent to said second solar subcell and composed of a semiconductor material having a third band gap smaller than the second band gap and being lattice matched with the second solar subcell;

a graded interlayer adjacent to said third solar subcell, said graded interlayer having a fourth band gap greater than said third band gap; and a fourth solar subcell adjacent to said third solar subcell and composed of a semiconductor material having a fifth band gap smaller than the fourth band gap and being lattice mismatched with the third solar subcell, and including a first contact on the top surface thereof, and a second contact on the bottom surface thereof;

wherein the graded interlayer is compositionally graded to lattice match the third solar subcell on one side and the lower fourth solar subcell on the other side, and is composed of any of the As, P, N, Sb based III-V compound semiconductors subject to the constraints of having the in-plane lattice parameter less than or equal to that of the third solar subcell and greater than or equal to that of the lower fourth solar subcell, (b) etching the semiconductor body from the substrate side to form first and second adjacent but electrically isolated semiconductor regions, each region including:

the upper first solar subcell;
the second solar subcell;
the third solar subcell;
the graded interlayer; and
in each region, a distinct and spatially separated fourth solar subcell.

In some embodiments, there further comprises:

(c) forming electrical connections so that the top contact region of the first semiconductor region is electrically coupled with the top contact of the second semiconductor region;

the first contact region on the top surface of the fourth solar subcell of the first semiconductor region is electrically coupled with the first contact region on the top surface of the fourth solar subcell of the second semiconductor region; and the second contact region on the bottom surface of the fourth solar subcell of the first semiconductor region is electrically coupled with the first contact region on the top surface of the fourth solar subcell of the second semiconductor region thereof.

In some embodiments, the short circuit density ($J_{sc}$) of the bottom subcell is at least three times that of the first, second and third subcells.

In some embodiments, the semiconductor body further comprises a first opening in the backside of the body extending from a bottom surface of the semiconductor body to the first lateral conduction layer; a second opening in the semiconductor body extending from the bottom surface of the first semiconductor body to the second lateral conduction layer; and a third opening in the first semiconductor body extending from a surface of the semiconductor body to the p-type semiconductor material of the bottom subcell of the semiconductor body.

In some embodiments, the solar cell assembly further comprises a first metallic contact pad disposed on the first lateral conduction layer of each of the semiconductor regions; and a second metallic contact pad disposed on the second lateral conduction layer of the semiconductor body; and an electrical interconnect connecting the first and second contact pads.

In some embodiments, the solar cell assembly further comprises a third metallic contact pad disposed on the second lateral conduction layer of the semiconductor regions; a fourth metallic contact pad disposed on the p-type semiconductor material of the bottom subcell of the semiconductor body; and an electrical interconnect connecting the third and fourth contact pads.

In another aspect, the present disclosure provides a multijunction solar cell including a terminal of first polarity and a terminal of second polarity comprising first and second semiconductor regions including substantially identical tandem vertical stacks of at least an upper first and a bottom second solar subcell lattice mismatched to the upper first solar subcell in which the second semiconductor region is disposed adjacent and parallel to the first semiconductor region; a bottom contact on the bottom second subcell of the second semiconductor region connected to the terminal of second polarity; a top electric contact on both the upper first subcells of the first and second semiconductor region electrically connected to the top electrical contacts to the terminal of first polarity; and an electrical interconnect connecting the bottom second subcell of the first semiconductor region in a series electrical circuit with the bottom second subcell of the second semiconductor region so that at least a multijunction solar cell is formed by the electrically interconnected semiconductor region. The series connection of the bottom subcell of the second semiconductor region incrementally increases the aggregate open circuit voltage of the assembly by 0.25 volts and the operating voltage by 0.21 volts, thereby increasing the power output of the solar cell.

In some embodiments, the average band gap of all four subcells (i.e., the sum of the four band gaps of each subcell divided by four) in the semiconductor body is greater than 1.44 eV, and the fourth subcell is comprised of a direct or indirect band gap material such that the lowest direct band gap of the material is greater than 0.75 eV.

In some embodiments, the fourth subcell is comprised of a direct or indirect band gap material such that the lowest direct band gap of the material is less than 0.90 eV.

In some instances, the upper first subcell of the first semiconductor body is composed of aluminium indium gallium phosphide (AlInGaP); the second solar subcell of the first semiconductor body is disposed adjacent to and lattice matched to said upper first subcell, and is composed of aluminum indium gallium arsenide (Al(In)GaAs); and the third subcell is disposed adjacent to said second subcell and is composed of indium gallium arsenide (In)GaAs.

In some cases (e.g., for an assembly having two subassemblies), the short circuit density ($J_{sc}/cm^2$) of each of the first and second subcells is approximately 12 mA/cm². In other instances (e.g., for an assembly having three subassemblies), the short circuit density ($J_{sc}/cm^2$) of each of the first, second and third middle subcells is approximately 10 mA/cm². The short circuit density ($J_{sc}/cm^2$) of the bottom subcell in the foregoing cases can be approximately greater than 24 mA/cm² or greater than 30 mA/cm². However, the short circuit densities ($J_{sc}/cm^2$) may have different values in some implementations.

In some embodiments, the band gap of the graded interlayer may be either constant or may vary throughout the thickness of the interlayer.

In some embodiments, there further comprises a distributed Bragg reflector (DBR) layer adjacent to and between the third and the fourth solar subcells and arranged so that light can enter and pass through the third solar subcell and at least a portion of which can be reflected back into the third solar subcell by the DBR layer.

In some embodiments, the distributed Bragg reflector layer is composed of a plurality of alternating layers of lattice matched materials with discontinuities in their respective indices of refraction.

In some embodiments, the difference in refractive indices between alternating layers is maximized in order to minimize the number of periods required to achieve a given reflectivity, and the thickness and refractive index of each period determines the stop band and its limiting wavelength.

In some embodiments, the DBR layer includes a first DBR layer composed of a plurality of n type or p type $Al_xGa_{1-x}(In)As$ layers, and a second DBR layer disposed over the first DBR layer and composed of a plurality of n type or p type $Al_yGa_{1-y}(In)As$ layers, where $0<x<1$, $0<y<1$, and y is greater than x, and (In) designates that indium is an optional constituent.

In another aspect, the present disclosure provides a multijunction solar cell and its method of manufacture including interconnected first and second discrete semiconductor regions disposed adjacent and parallel to each other in a single semiconductor body, including first top subcell, second (and possibly third) lattice matched middle subcells; a graded interlayer adjacent to the last middle solar subcell; and a bottom solar subcell adjacent to said graded interlayer being lattice mismatched with respect to the last middle solar subcell; wherein the interconnected regions form at least a four junction solar cell by a series connection being formed between the bottom solar subcell in the first semiconductor region and the bottom solar subcell in the second semiconductor region.

In another aspect, the present disclosure provides a method of manufacturing a five junction solar cell comprising providing a germanium substrate; growing on the germanium substrate a sequence of layers of semiconductor material using a MOCVD semiconductor disposition process to form a solar cell comprising a plurality of subcells including a metamorphic layer, growing a third subcell over the metamorphic layer having a band gap of approximately 1.30 eV to 1.41 eV, growing a second subcell over the third subcell having a band gap in the range of approximately 1.65 to 1.8 eV, and growing an upper first subcell over the second subcell having a band gap in the range of 2.0 to 2.20 eV.

In some embodiments, there further comprises (i) a back surface field (BSF) layer disposed directly adjacent to the bottom surface of the third subcell, and (ii) at least one distributed Bragg reflector (DBR) layer directly below the BSF layer so that light can enter and pass through the first, second and third subcells and at least a portion of which be reflected back into the third subcell by the DBR layer.

In some embodiments, the fourth (i.e., bottom) subcell of each of the solar cell subassemblies is composed of germanium. The indirect band gap of the germanium at room temperature is about 0.66 eV, while the direct band gap of germanium at room temperature is 0.8 eV. Those skilled in the art with normally refer to the "band gap" of germanium as 0.66 eV, since it is lower than the direct band gap value of 0.8 eV. Thus, in some implementations, the fourth subcell has a direct band gap of greater than 0.75 eV. Reference to the fourth subcell having a direct band gap of greater than 0.75 eV is expressly meant to include germanium as a possible semiconductor material for the fourth subcell, although other semiconductor materials can be used as well. In other instances, the fourth subcell may have a direct band gap of less than 0.90 eV. For example, the fourth subcell may be composed of InGaAs, GaAsSb, InAsP, InAlAs, or SiGeSn, InGaAsN, InGaAsNSb, InGaAsNBi, or other III-V or II-VI compound semiconductor materials.

In some embodiments, additional layer(s) may be added or deleted in the cell structure without departing from the scope of the present disclosure.

Some implementations can include additional solar subcells in one or more of the semiconductor bodies.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The invention will be better and more fully appreciated by reference to the following detailed description when considered in conjunction with the accompanying drawings, wherein.

GLOSSARY OF TERMS

Figure 1:
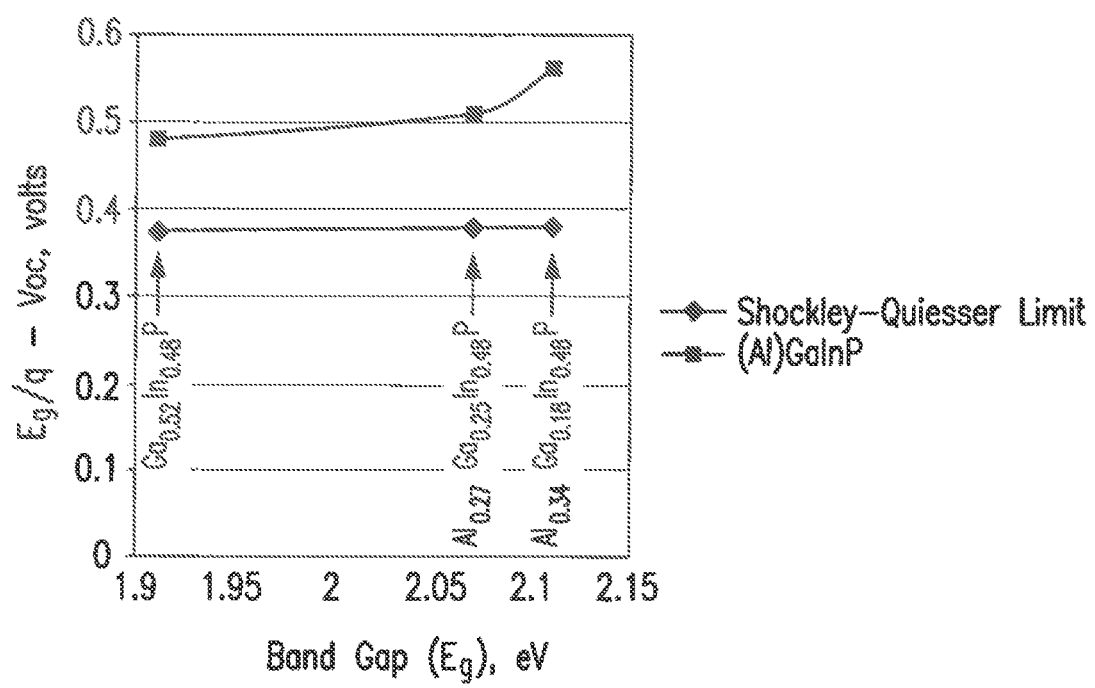
FIG. 1 is a graph representing the BOL value of the parameter $E_g/q-V_{oc}$ at 28° C. plotted against the band gap of certain ternary and quaternary materials defined along the x-axis.

"III-V compound semiconductor" refers to a compound semiconductor formed using at least one elements from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material.

"Beginning of Life (BOL)" refers to the time at which a photovoltaic power system is initially deployed in operation.

"Bottom subcell" refers to the subcell in a multijunction solar cell which is furthest from the primary light source for the solar cell.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"Deposited", with respect to a layer of semiconductor material, refers to a layer of material which is epitaxially grown over another semiconductor layer.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which would normally be the "top" subcells facing the solar radiation in the final deployment configuration, are deposited or grown on a growth substrate prior to depositing or growing the lower band gap subcells.

"Layer" refers to a relatively planar sheet or thickness of semiconductor or other material. The layer may be deposited or grown, e.g., by epitaxial or other techniques.

"Lattice mismatched" refers to two adjacently disposed materials or layers (with thicknesses of greater than 100 nm) having in-plane lattice constants of the materials in their fully relaxed state differing from one another by less than 0.02% in lattice constant. (Applicant expressly adopts this definition for the purpose of this disclosure, and notes that this definition is considerably more stringent than that proposed, for example, in U.S. Pat. No. 8,962,993, which suggests less than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Short circuit current ($I_{sc}$)" refers to the amount of electrical current through a solar cell or solar subcell when the voltage across the solar cell is zero volts, as represented and measured, for example, in units of milliamps.

"Short circuit current density"—see "current density".

"Solar cell" refers to an electronic device operable to convert the energy of light directly into electricity by the photovoltaic effect.

"Solar cell assembly" refers to two or more solar cell subassemblies interconnected electrically with one another.

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"ZTJ" refers to the product designation of a commercially available SolAero Technologies Corp. triple junction solar cell.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells (as well as inverted metamorphic multijunction solar cells) are disclosed in the related applications noted above. Some, many or all of such features may be included in the structures and processes associated with the non-inverted or "upright" solar cells of the present disclosure. However, more particularly, the present disclosure is directed to the fabrication of a multijunction lattice matched solar cell grown over a metamorphic layer which is grown on a single growth substrate which comprises two or more interconnected solar cell subassemblies. More specifically, however, in some embodiments, the present disclosure relates to a multijunction solar cell with direct band gaps in the range of 2.0 to 2.15 eV (or higher) for the top subcell, and (i) 1.65 to 1.8 eV, and (ii) 1.41 eV for the middle subcells, and 0.6 to 0.9 eV direct or indirect band gaps, for the bottom subcell(s), respectively, and the connection of two or more such subassemblies to form a solar cell assembly.

The conventional wisdom for many years has been that in a monolithic multijunction tandem solar cell, " . . . the desired optical transparency and current conductivity between the top and bottom cells . . . would be best achieved by lattice matching the top cell material to the bottom cell material. Mismatches in the lattice constants create defects or dislocations in the crystal lattice where recombination centers can occur to cause the loss of photogenerated minority carriers, thus significantly degrading the photovoltaic quality of the device. More specifically, such effects will decrease the open circuit voltage ($V_{oc}$), short circuit current ($J_{sc}$), and fill factor (FF), which represents the relationship or balance between current and voltage for effective output" (Jerry M. Olson, U.S. Pat. No. 4,667,059, "Current and Lattice Matched Tandem Solar Cell").

As progress has been made toward higher efficiency multijunction solar cells with four or more subcells, nevertheless, "it is conventionally assumed that substantially lattice-matched designs are desirable because they have proven reliability and because they use less semiconductor material than metamorphic solar cells, which require relatively thick buffer layers to accommodate differences in the lattice constants of the various materials" (Rebecca Elizabeth Jones-Albertus et al., U.S. Pat. No. 8,962,993).

Even more recently " . . . current output in each subcell must be the same for optimum efficiency in the series-connected configuration" (Richard R. King et al., U.S. Pat. No. 9,099,595).

The present disclosure provides a solar cell subassembly with an unconventional four junction design (with three grown lattice matched subcells, which are lattice mismatched to the Ge substrate) that leads to significant performance improvement over that of traditional three junction solar cell on Ge despite the substantial current mismatch present between the top three junctions and the bottom Ge junction. This performance gain is especially realized at high temperature and after high exposure to space radiation by the proposal of incorporating high band gap semiconductors that are inherently more resistant to radiation and temperature.

As described in greater detail, the present application further notes that interconnecting two or more spatially split multijunction solar cell subassemblies (with each subassembly incorporating Applicant's unconventional design) can be even more advantageous. The spatial split can be provided for multiple solar cell subassemblies monolithically formed on the same substrate according to the present disclosure. Alternatively, the solar cell subassemblies can be fabricated as separate semiconductor chips that can be coupled together electrically, as described in related applications.

In general terms, a solar cell assembly in accordance with one aspect of the present disclosure, can include a terminal of first polarity and a terminal of second polarity. The solar cell assembly includes a first semiconductor subassembly including a tandem vertical stack of at least a first upper, a second, third and fourth bottom solar subcells, the first upper subcell having a top contact connected to the terminal of first polarity. A second semiconductor subassembly is disposed adjacent to the first semiconductor subassembly and includes a tandem vertical stack of at least a first upper, a second, third, and fourth bottom solar subcells, the fourth bottom subcell having a back side contact connected to the terminal of second polarity. The fourth subcell of the first semiconductor subassembly is connected in a series electrical circuit with the third subcell of the second semiconductor subassembly. Thus, a five-junction solar assembly is assembled from two four-junction solar cell subassemblies.

In some cases, the foregoing solar cell assembly can provide increased photoconversion efficiency in a multijunction solar cell for outer space or other applications over the operational life of the photovoltaic power system.

Another aspect of the present disclosure is that to provide a five junction solar cell assembly composed of an integral semiconductor body with two interconnected spatially separated four junction solar cell subassemblies or regions, the average band gap of all four subcells (i.e., the sum of the four band gaps of each subcell divided by 4) in each solar cell subassembly being greater than 1.44 eV.

Another descriptive aspect of the present disclosure is to characterize the fourth subcell as being composed of an indirect or direct band gap material such that the lowest direct band gap is greater than 0.75 eV, in some embodiments.

Another descriptive aspect of the present disclosure is to characterize the fourth subcell as being composed of a direct band gap material such that the lowest direct band gap is less than 0.90 eV, in some embodiments.

In some embodiments, the fourth subcell in each solar cell subassembly is germanium, while in other embodiments the fourth subcell is InGaAs, GaAsSb, InAsP, InAlAs, or SiGeSn, InGaAsN, InGaAsNSb, InGaAsNBi, InGaAsNSbBi, InGaSbN, InGaBiN, InGaSbBiN or other III-V or II-VI compound semiconductor material.

The indirect band gap of germanium at room temperature is about 0.66 eV, while the direct band gap of germanium at room temperature is 0.8 eV. Those skilled in the art will normally refer to the "band gap" of germanium as 0.66 eV, since it is lower than the direct band gap value of 0.8 eV.

The recitation that "the fourth subcell has a direct band gap of greater than 0.75 eV" is therefore expressly meant to include germanium as a possible semiconductor for the fourth subcell, although other semiconductor materials can be used as well.

More specifically, the present disclosure intends to provide a relatively simple and reproducible technique that does not employ inverted processing associated with inverted metamorphic multijunction solar cells, and is suitable for use in a high volume production environment in which various semiconductor layers are grown on a growth substrate in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

The lattice constants and electrical properties of the layers in the semiconductor structure are preferably controlled by specification of appropriate reactor growth temperatures and times, and by use of appropriate chemical composition and dopants. The use of a deposition method, such as Molecular Beam Epitaxy (MBE), Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type.

The present disclosure is directed to, in one embodiment, a growth process using a metal organic chemical vapor deposition (MOCVD) process in a standard, commercially available reactor suitable for high volume production. More particularly, the present disclosure is directed to the materials and fabrication steps that are particularly suitable for producing commercially viable multijunction solar cells using commercially available equipment and established high-volume fabrication processes, as contrasted with merely academic expositions of laboratory or experimental results.

Prior to discussing the specific embodiments of the present disclosure, a brief discussion of some of the issues associated with the design of multijunction solar cells, and in particular metamorphic solar cells, and the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes and suited for specific applications such as the space environment where the efficiency over the entire operational life is an important goal, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

In view of the foregoing, it is further evident that the identification of one particular constituent element (e.g.

indium, or aluminum) in a particular subcell, or the thickness, band gap, doping, or other characteristic of the incorporation of that material in a particular subcell, is not a single, simple "result effective variable" that one skilled in the art can simply specify and incrementally adjust to a particular level and thereby increase the efficiency of a solar cell at the beginning of life or the end of life, or over a particular time span of operational use. The efficiency of a solar cell is not a simple linear algebraic equation as a function of band gap, or the amount of gallium or aluminum or other element in a particular layer. The growth of each of the epitaxial layers of a solar cell in an MOCVD reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Another aspect of the disclosure is to match the larger short circuit current of the bottom subcell of the solar cell assembly with two or three parallel stacks of solar subcells, i.e. a configuration in which the value of the short circuit current of the bottom subcell is at least twice, or at least three times, that of the solar subcells in each parallel stack which are connected in series with the bottom subcell. Stated another way, given the choice of the composition of the bottom subcell, and thereby the short circuit current of the bottom subcell, the upper subcell stack is specified and designated to have a short circuit current which is one-third or less or is one-half or less than that of the bottom subcell.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, in a given environment over the operational life, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and "unexpected results", and constitute an "inventive step" in designing and specifying a solar cell to operate in a predetermined environment (such as space), not only at the beginning of life, but over the entire defined operational lifetime.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One aspect of the present disclosure relates to the use and amount of aluminum in the active layers of the upper subcells in a multijunction solar cell (i.e. the subcells that are closest to the primary light source). The effects of increasing amounts of aluminum as a constituent element in an active layer of a subcell affects the photovoltaic device performance. One measure of the "quality" or "goodness" of a solar cell subcell or junction is the difference between the band gap of the semiconductor material in that subcell or junction and the $V_{oc}$, or open circuit voltage, of that same junction. The smaller the difference, the higher the $V_{oc}$ of the solar cell junction relative to the band gap, and the better the performance of the device. $V_{oc}$ is very sensitive to semiconductor material quality, so the smaller the $E_g/q-V_{oc}$ of a device, the higher the quality of the material in that device. There is a theoretical limit to this difference, known as the Shockley-Queisser limit. That is the best voltage that a solar cell junction can produce under a given concentration of light at a given temperature.

The experimental data obtained for single junction (Al) GaInP solar cells indicates that increasing the Al content of the junction leads to a larger $E_g/q-V_{oc}$ difference, indicating that the material quality of the junction decreases with increasing Al content. FIG. 1 shows this effect. The three compositions cited in the Figure are all lattice matched to GaAs, but have differing Al composition. As seen by the different compositions represented, with increasing amount of aluminum represented by the x-axis, adding more Al to the semiconductor composition increases the band gap of the junction, but in so doing also increases $E_g/q-V_{oc}$. Hence, we draw the conclusion that adding Al to a semiconductor material degrades that material such that a solar cell device made out of that material does not perform relatively as well as a junction with less Al.

Thus, contrary to the conventional wisdom as indicated above, the present application utilizes a substantial amount of aluminum, i.e., over 20% aluminum by mole fraction in at least the top subcell, and in some embodiments in one or more of the middle subcells.

Figure 2A:
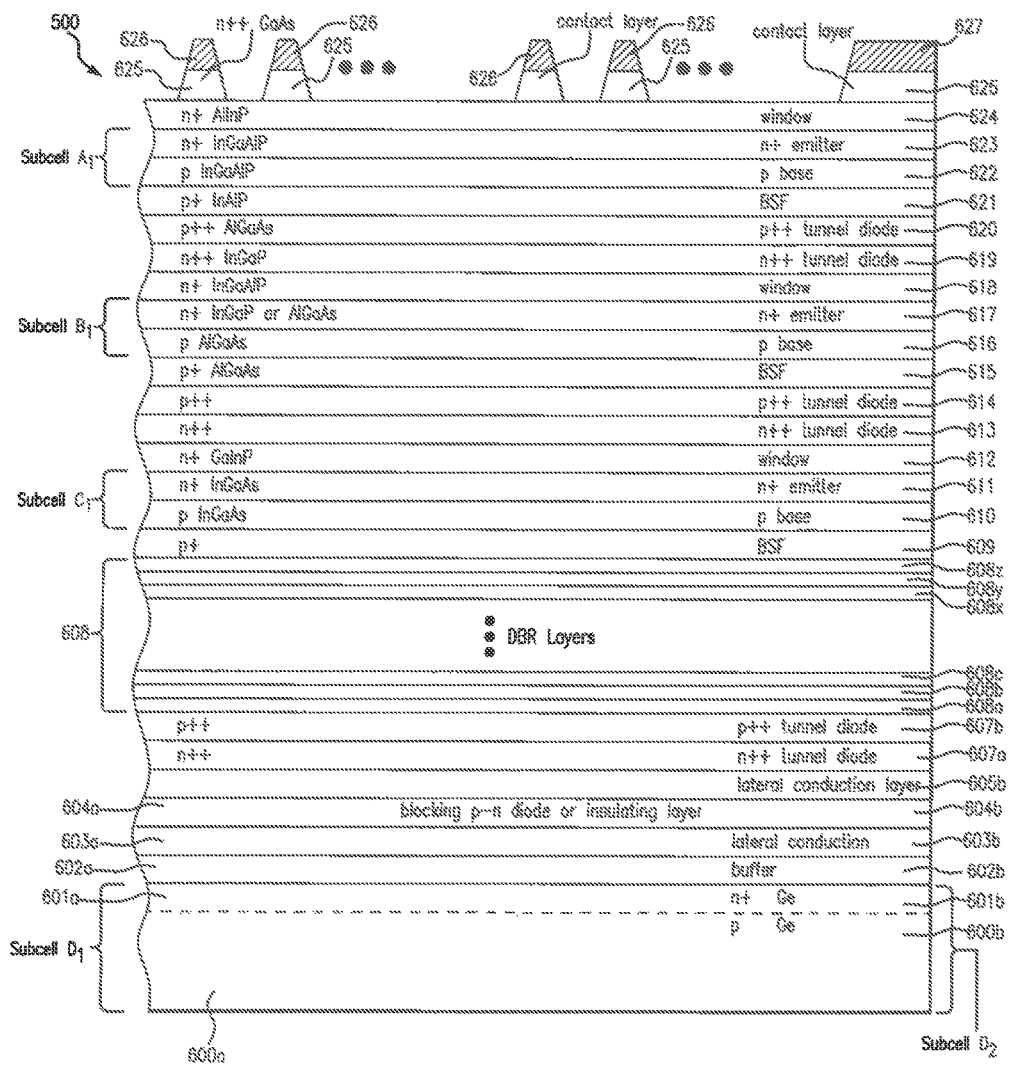
FIG. 2A is a cross-sectional view of a first embodiment of a semiconductor body including a four solar subcells after several stages of fabrication including the growth of certain semiconductor layers on the growth substrate up to the contact layer, according to the present disclosure.

Turning to the fabrication of the multijunction solar cell assembly of the present disclosure, and in particular a five-junction solar cell assembly, FIG. 2A is a cross-sectional view of a first embodiment of a semiconductor body 500 after several stages of fabrication including the growth of certain semiconductor layers on the growth substrate, and formation of grids and contacts on the contact layer of the top side (i.e., the light-facing side) of the semiconductor body.

As shown in the illustrated example of FIG. 2A, the bottom subcell (which we refer to initially as subcell D) includes a substrate 600 formed of p-type germanium ("Ge") in some embodiments, which also serves as a base layer of the subcell (i.e., the p-polarity layer of a "base-emitter" photovoltaic junction formed by adjacent layers of opposite conductivity type).

In some embodiments, the bottom subcell D is germanium, while in other embodiments the fourth subcell is InGaAs, GaAsSb, InAsP, InAlAs, or SiGeSn, InGaAsN, InGaAsNSb, InGaAsNBi, InGaAsNSbBi, InGaSbN, InGaBiN, InGaSbBiN or other III-V or II-VI compound semiconductor material.

The bottom subcell D, further includes, for example, a highly doped n-type Ge emitter layer 601, and an n-type indium gallium arsenide ("InGaAs") nucleation layer 602. The nucleation layer or buffer 602 is deposited over the base layer, and the emitter layer 601 is formed in the substrate by diffusion of atoms from the nucleation layer 602 into the Ge substrate, thereby forming the n-type Ge layer 601b.

A highly doped first lateral conduction layer 603 is deposited over layer 602, and a blocking p-n diode or insulating layer 604 is deposited over the layer 603. A second highly doped lateral conduction layer 605 is then deposited over layer 604.

Heavily doped p-type aluminum gallium arsenide ("AlGaAs") and heavily doped n-type indium gallium arsenide ("(In)GaAs") tunneling junction layers 606, 607 may be deposited over the second lateral conduction layer 605 to provide a low resistance pathway between the bottom D and the middle subcell C.

In some embodiments, distributed Bragg reflector (DBR) layers 608 are then grown adjacent to and between the tunnel junction 606/607 and the third solar subcell $C_1$. The DBR layers 608 are arranged so that light can enter and pass through the third solar subcell $C_1$ and at least a portion of which can be reflected back into the third solar subcell $C_1$ by the DBR layers 608. In the embodiment depicted in FIG. 2A, the distributed Bragg reflector (DBR) layers 608 are specifically located between the third solar subcell C and tunnel junction layers 607; in other embodiments, the distributed Bragg reflector tunnel diode layers 606/607 may be located between DBR layer 608 and the third subcell $C_1$. In another embodiment, depicted in FIG. 2C, the tunnel diode layer 670/671 are located between the lateral conduction layer 602d and the first alpha layer 606.

For some embodiments, distributed Bragg reflector (DBR) layers 608 can be composed of a plurality of alternating layers 608a through 608z of lattice matched materials with discontinuities in their respective indices of refraction. For certain embodiments, the difference in refractive indices between alternating layers is maximized in order to minimize the number of periods required to achieve a given reflectivity, and the thickness and refractive index of each period determines the stop band and its limiting wavelength.

For some embodiments, distributed Bragg reflector (DBR) layers 608a through 608z includes a first DBR layer composed of a plurality of p type $Al_x(In)Ga_{1-x}As$ layers, and a second DBR layer disposed over the first DBR layer and composed of a plurality of p type $Al_y(In)Ga_{1-y}As$ layers, where y is greater than x, with $0<x<1$, $0<y<1$.

On top of the DBR layers 608 the subcell $C_1$ is grown.

In the illustrated example of FIG. 2A, the subcell $C_1$ includes a highly doped p-type aluminum gallium arsenide ("Al(In)GaAs") back surface field ("BSF") layer 609, a p-type InGaAs base layer 610, a highly doped n-type indium gallium phosphide ("InGaP2") emitter layer 611 and a highly doped n-type indium aluminum phosphide ("AlInP2") window layer 612. The InGaAs base layer 610 of the subcell $C_1$ can include, for example, approximately 1.5% In. Other compositions may be used as well. The base layer 610 is formed over the BSF layer 609 after the BSF layer is deposited over the DBR layers 608a through 608z.

The window layer 612 is deposited on the emitter layer 611 of the subcell $C_1$. The window layer 612 in the subcell $C_1$ also helps reduce the recombination loss and improves passivation of the cell surface of the underlying junctions. Before depositing the layers of the subcell B, heavily doped n-type InGaP and p-type Al(In)GaAs (or other suitable compositions) tunneling junction layers 613, 614 may be deposited over the subcell $C_1$.

The middle subcell $B_1$ includes a highly doped p-type aluminum (indium) gallium arsenide ("Al(In)GaAs") back surface field ("BSF") layer 615, a p-type Al(In)GaAs base layer 616, a highly doped n-type indium gallium phosphide ("InGaP2") or Al(In)GaAs layer 617 and a highly doped n-type indium gallium aluminum phosphide ("AlGaAlP") window layer 618. The InGaP emitter layer 617 of the subcell $B_1$ can include, for example, approximately 50% In. Other compositions may be used as well.

Before depositing the layers of the top cell $A_1$, heavily doped n-type InGaP and p-type Al(In)GaAs tunneling junction layers 619, 620 may be deposited over the subcell B.

In the illustrated example, the top subcell $A_1$ includes a highly doped p-type indium aluminum phosphide ("InAlP") BSF layer 621, a p-type InGaAlP base layer 622, a highly doped n-type InGaAlP emitter layer 623 and a highly doped n-type InAlP2 window layer 624. The base layer 623 of the top subcell $A_1$ is deposited over the BSF layer 621 after the BSF layer 621 is formed over the tunneling junction layers 619, 620 of the subcell $B_1$. The window layer 624 is deposited over the emitter layer 623 of the top subcell $A_1$ after the emitter layer 623 is formed over the base layer 622.

In some embodiments, the amount of aluminum in the top subcell A, is 20% or more by mole fraction.

A cap or contact layer 625 may be deposited and patterned into separate contact regions over the window layer 624 of the top subcell $A_1$. After further processing to be described in subsequent Figures, the solar cell assembly 500 can be provided with grid lines, interconnecting bus lines, and contact pads on the top surface. The geometry and number of the grid lines, bus lines and/or contacts may vary in different implementations.

The cap or contact layer 625 serves as an electrical contact from the top subcell $A_1$ to metal grid 626. The doped cap or contact layer 625 can be a semiconductor layer such as, for example, a GaAs or InGaAs layer.

After the cap or contact layer 625 is deposited, the grid lines 626 are formed via evaporation and lithographically patterned and deposited over the cap or contact layer 625.

A contact pad 627 connected to the grid 626 is formed on one edge of the subassembly 500 to allow an electrical interconnection to be made, inter alia, to an adjacent subassembly.

The subcells $A_2$, $B_2$, $C_2$ of the solar cell subassembly 500 can be configured so that the short circuit current densities of the three subcells $A_2$, $B_2$, $C_2$ have a substantially equal predetermined first value (i.e., J1=J2=J3), and the short circuit current density (J4) of the bottom subcell $D_2$ is at least twice that of the predetermined first value.

Figure 2B:
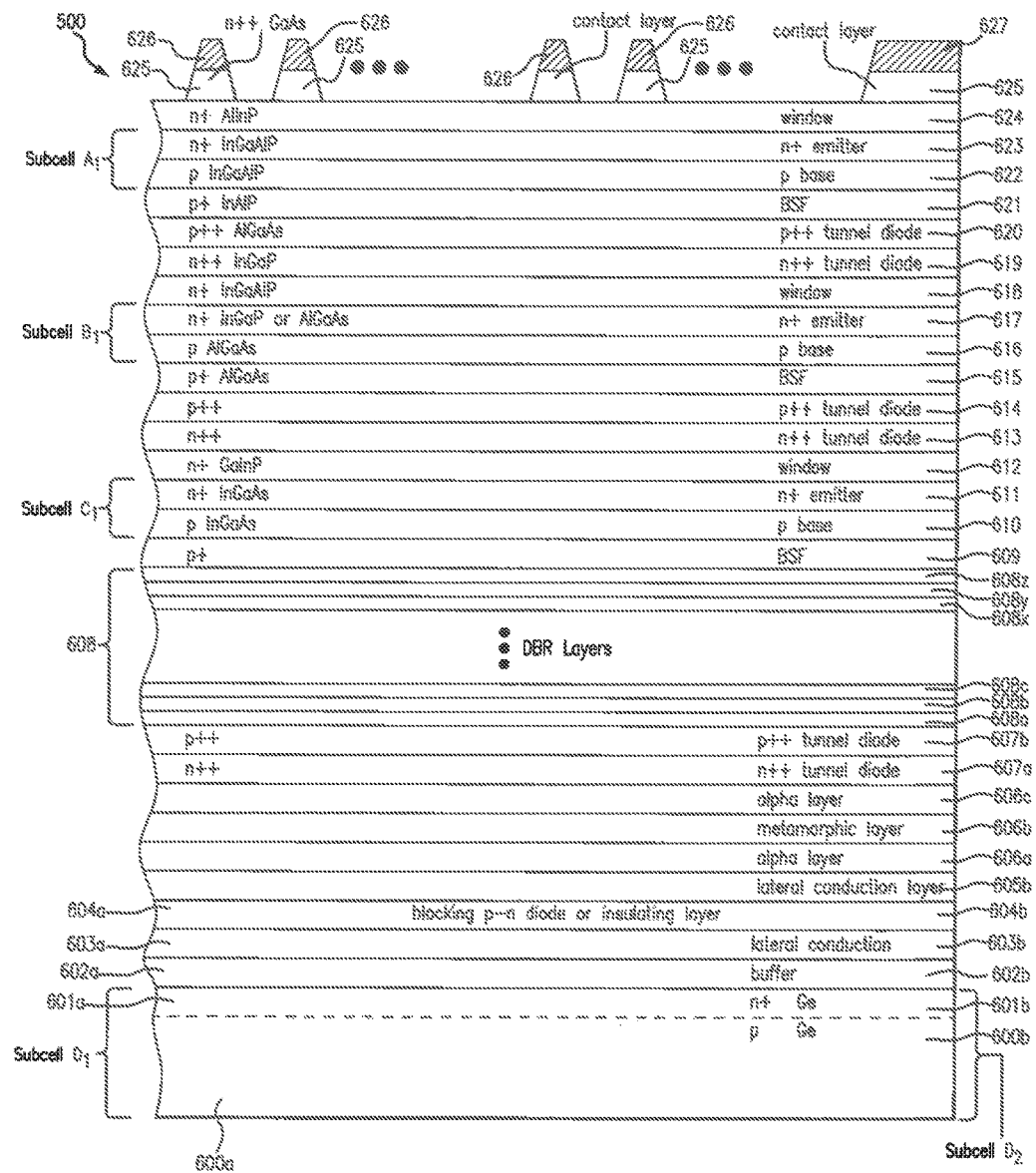
FIG. 2B is a cross-sectional view of a second embodiment of a semiconductor body including a four solar subcells including two lattice mismatched subcells with a metamorphic layer between them, after several stages of fabrication including the growth of certain semiconductor layers on the growth substrate up to the contact layer, according to the present disclosure.

FIG. 2B is a cross-sectional view of a second embodiment of a semiconductor body including a four solar subcells including two lattice mismatched subcells with a metamorphic layer between them, after several stages of fabrication including the growth of certain semiconductor layers on the growth substrate up to the contact layer, according to the present disclosure.

As shown in the previously illustrated example of FIG. 2A, the bottom subcell (which we refer to initially as subcell D) includes a substrate 600 formed of p-type germanium ("Ge") in some embodiments, which also serves as a base layer, and since the layers 601 through 605 are substantially the same as described in connection with FIG. 2A, they will not be described in detail here for brevity.

In the embodiment of FIG. 2B, a first alpha layer 606a, composed of n-type (Al)GaIn(As)P, is deposited over the first lateral conduction layer 605, to a thickness of between 0.25 and 1.0 micron. Such an alpha layer is intended to prevent threading dislocations from propagating, either opposite to the direction of growth into the bottom subcell D, or in the direction of growth into the subcell C, and is more particularly described in U.S. Patent Application Pub. No. 2009/0078309 A1 (Cornfeld et al.).

A metamorphic layer (or graded interlayer) 606b is deposited over the first alpha layer 606a using a surfactant. Layer 604 is preferably a compositionally step-graded series of InGaAlAs layers, preferably with monotonically changing lattice constant, so as to achieve a gradual transition in lattice constant in the semiconductor structure from subcell $D_1$ to subcell $C_1$ while minimizing threading dislocations from occurring. The band gap of layer 606b is either constant throughout its thickness, in one embodiment approximately equal to 1.42 to 1.62 eV, or otherwise consistent with a value slightly greater than the band gap of the middle subcell $C_1$, or may vary within the above noted region. One embodiment of the graded interlayer may also be expressed as being composed of $(Al)In_xGa_{1-x}As$, with 0<x<1, and x selected such that the band gap of the interlayer is in the range of at approximately 1.42 to 1.62 eV or other appropriate band gap.

In the surfactant assisted growth of the metamorphic layer 606b, a suitable chemical element is introduced into the reactor during the growth of layer 606b to improve the surface characteristics of the layer. In one embodiment, such element may be a dopant or donor atom such as selenium (Se) or tellurium (Te). Small amounts of Se or Te are therefore incorporated in the metamorphic layer 604, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 606b.

In one embodiment of the present disclosure, the layer 606b is composed of a plurality of layers of (Al)InGaAs, with monotonically changing lattice constant, each layer having a band gap, approximately in the range of 1.42 to 1.62 eV. In some embodiments, the band gap is in the range of 1.45 to 1.55 eV. In some embodiments, the band gap is in the range of 1.5 to 1.52 eV.

The advantage of utilizing the embodiment of a constant bandgap material such as InGaAs is that arsenide-based semiconductor material is much easier to process in standard commercial MOCVD reactors.

Although the preferred embodiment of the present disclosure utilizes a plurality of layers of (Al)InGaAs for the metamorphic layer 606b for reasons of manufacturability and radiation transparency, other embodiments of the present disclosure may utilize different material systems to achieve a change in lattice constant from subcell $C_1$ to subcell D. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater than or equal to that of the third solar cell and less than or equal to that of the fourth solar cell, and having a bandgap energy greater than that of the third solar cell.

A second alpha layer 606c, composed of n+ type GaInP, is deposited over metamorphic buffer layer 606b, to a thickness of between 0.25 and about 1.0 micron. Such second alpha layer is intended to prevent threading dislocations from propagating, either opposite to the direction of growth into the subcell D, or in the direction of growth into the subcell $C_1$, and is more particularly described in U.S. Patent Application Pub. No. 2009/0078309 A1 (Cornfeld et al.).

Figure 2C:
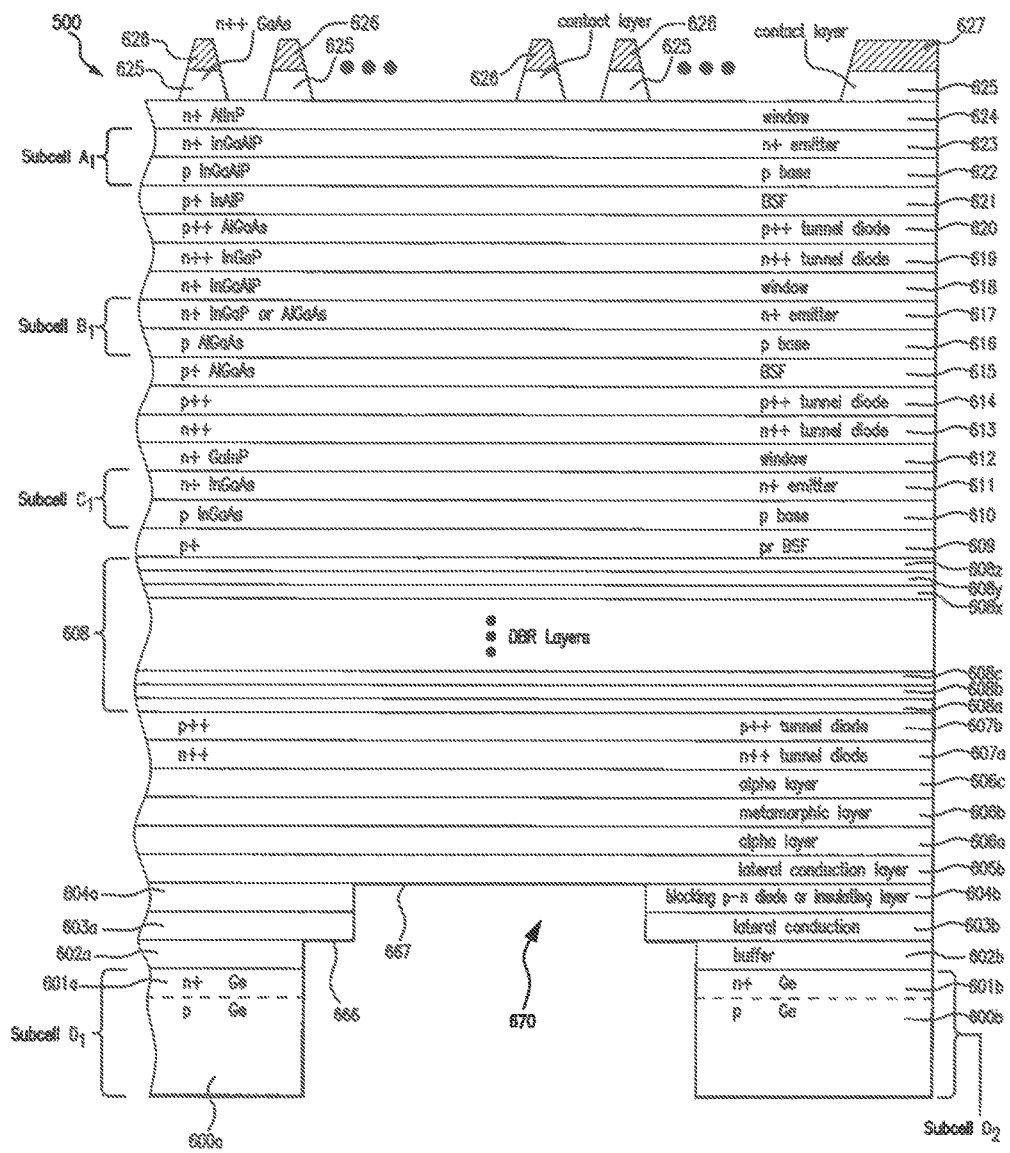
FIG. 2C is a cross-sectional view of the embodiment of FIG. 2B following the steps of etching contact ledges on various semiconductor layers according to a first implementation in the present disclosure.

A second embodiment of the second solar cell subassembly similar to that of FIG. 2C is another configuration (not shown) with that the metamorphic buffer layer 604 is disposed above the tunnel diode layers 706, 707 and below the DBR layers 708 (not illustrated).

Heavily doped p-type aluminum gallium arsenide ("AlGaAs") and heavily doped n-type indium gallium arsenide ("(In)GaAs") tunneling junction layers 607a, 607b may be deposited over the alpha layer 606c to provide a low resistance pathway between the bottom and middle subcells D and $C_1$.

Since the tunnel diode layers 607a, 607b, and the subsequently grown layers 608 through 625 are substantially the same as described in connection with FIG. 2A, they will not be described here in detail for brevity.

Turing to FIG. 2C, following the deposition of the semiconductor layers 602 through 625, the semiconductor body 501 is partially etched from the backside (i.e., through the substrate 600) to form a channel 670 that partially bisects the wafer or semiconductor body, and several ledges or platforms are formed on intermediate layers so that electrical contact may be made thereto, in particular, in one embodiment depicted in this Figure, ledges 666, and 667.

To this end, the solar cell assembly can include a plurality of openings in the semiconductor body, each of the openings extending from a bottom surface of the semiconductor body to a different respective layer in the semiconductor body. Such "openings" may include recesses, cavities, holes, gaps, cut-outs, or similar structures, but for simplicity we will subsequently just use the term "opening" throughout this disclosure. In other implementations, we can etch through the top or the side of the substrate and have some or all the openings come from one or more sides. This approach may be more efficient than etching from the top side as it does not shadow the top two or top three solar subcells, and results in a solar epitaxial structure of only a few tens of microns in thickness.

Figure 2D:
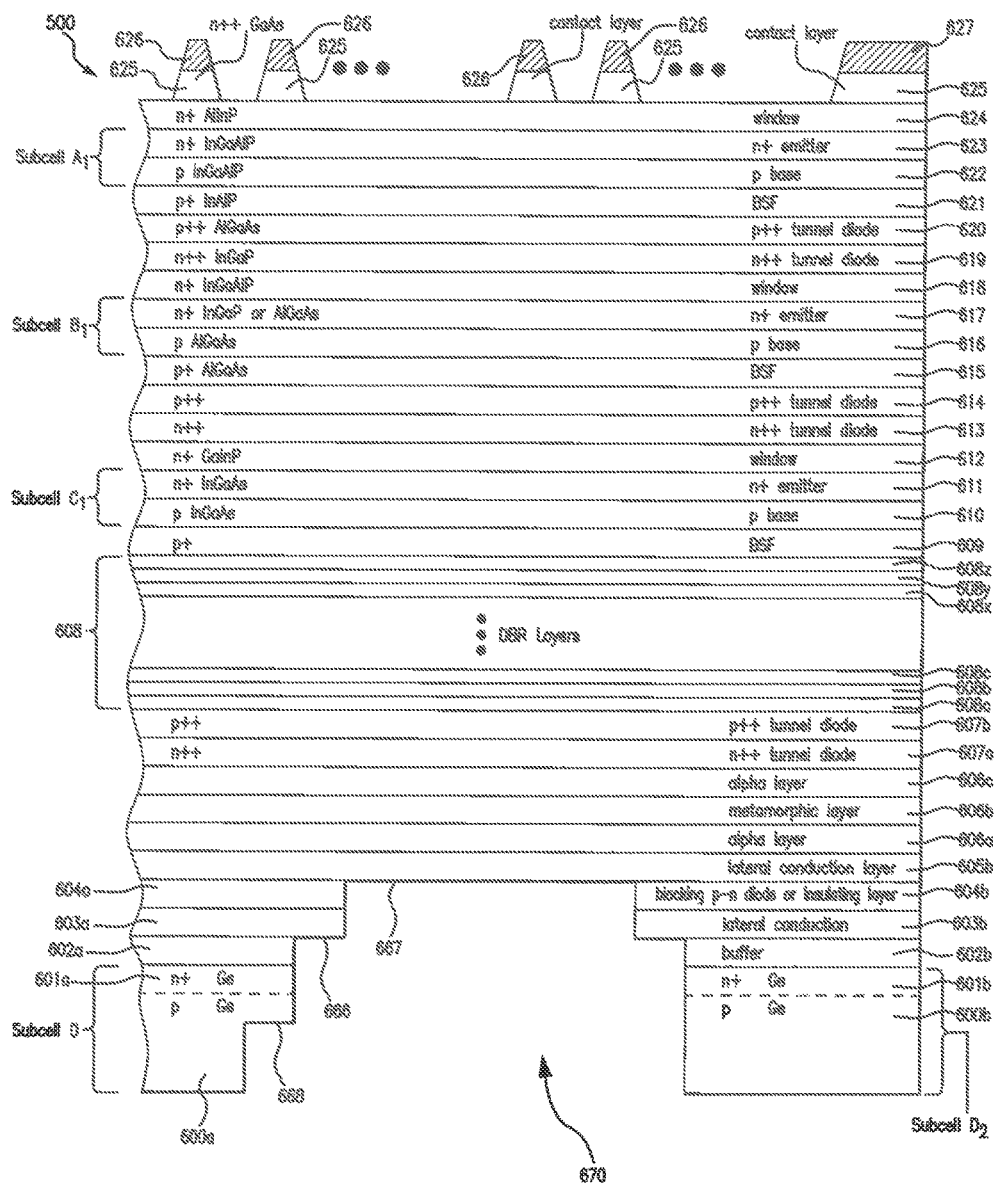
FIG. 2D is a cross-sectional view of the embodiment of FIG. 2B following the steps of etching contact ledges on various semiconductor layers according to a second implementation in the present disclosure.

FIG. 2D is a cross-sectional view of the embodiment of FIG. 2B following the steps of etching contact ledges on various semiconductor layers according to a second implementation in the present disclosure. In particular, in addition to the two ledges 667 and 666 depicted in FIG. 2C, there is a third ledge 668 in the substrate 600 which is etched to allow electrical contact to be made to the p terminal of subcell D.

As a result of the etching process depicted in FIG. 2C or FIG. 2D, the semiconductor body 501 is divided into two semiconductor regions, with one depicted on the left hand side of the Figure and one on the right hand side. The bottom surface of a portion of the highly doped second lateral conduction layer 605 is exposed by the etching process and forms a ledge 667. The blocking p-n diode or insulating layer 604 is divided into two portions, with one in each of the respective semiconductor region, one portion 604a being on the left and one portion 604b being on the right of the Figure. Similarly, the first highly doped lateral conduction layer 603 is divided into two parts, with one in each respective semiconductor region, one portion 603a on the left and one portion 603b on the right of the Figure. A ledge 666 is formed on the left portion 603a of the first highly doped lateral conduction layer 603, and a ledge 669 is formed on the right portion 603b of the first highly doped lateral conduction layer 603.

The buffer layer 602 and the subcell D 600/601 is divided into two semiconductor regions. One portion 602a of the buffer layer on the left hand side of the Figure and one portion 602b of the buffer layer on the right hand side. One portion 600a/601a of the solar subcell D (which we now designate as solar subcell $D_1$) on the left hand side of the Figure and one portion 600a/601a of the solar cell D (which we now designate as solar subcell $D_2$) the right hand side. A ledge 668 is formed on the left portion 600a of the subcell $D_1$.

After the cap or contact layer 625 is deposited, the grid lines 626 are formed via evaporation and lithographically patterned and deposited over the cap or contact layer 625.

A contact pad 627 connected to the grid 626 is formed on one edge of the subassembly 500 to allow an electrical interconnection to be made, inter alia, to an adjacent subassembly.

As with the first solar cell subassembly 500, the subcells $A_2$, $B_2$, $C_2$ of the second solar cell subassembly 700 can be configured so that the short circuit current densities of the three subcells $A_2$, $B_2$, $C_2$ have a substantially equal predetermined first value (J1<=J2<=J3), and the short circuit current density (J4) of the bottom subcell $D_2$ is at least twice that of the predetermined first value.

Figure 2E:
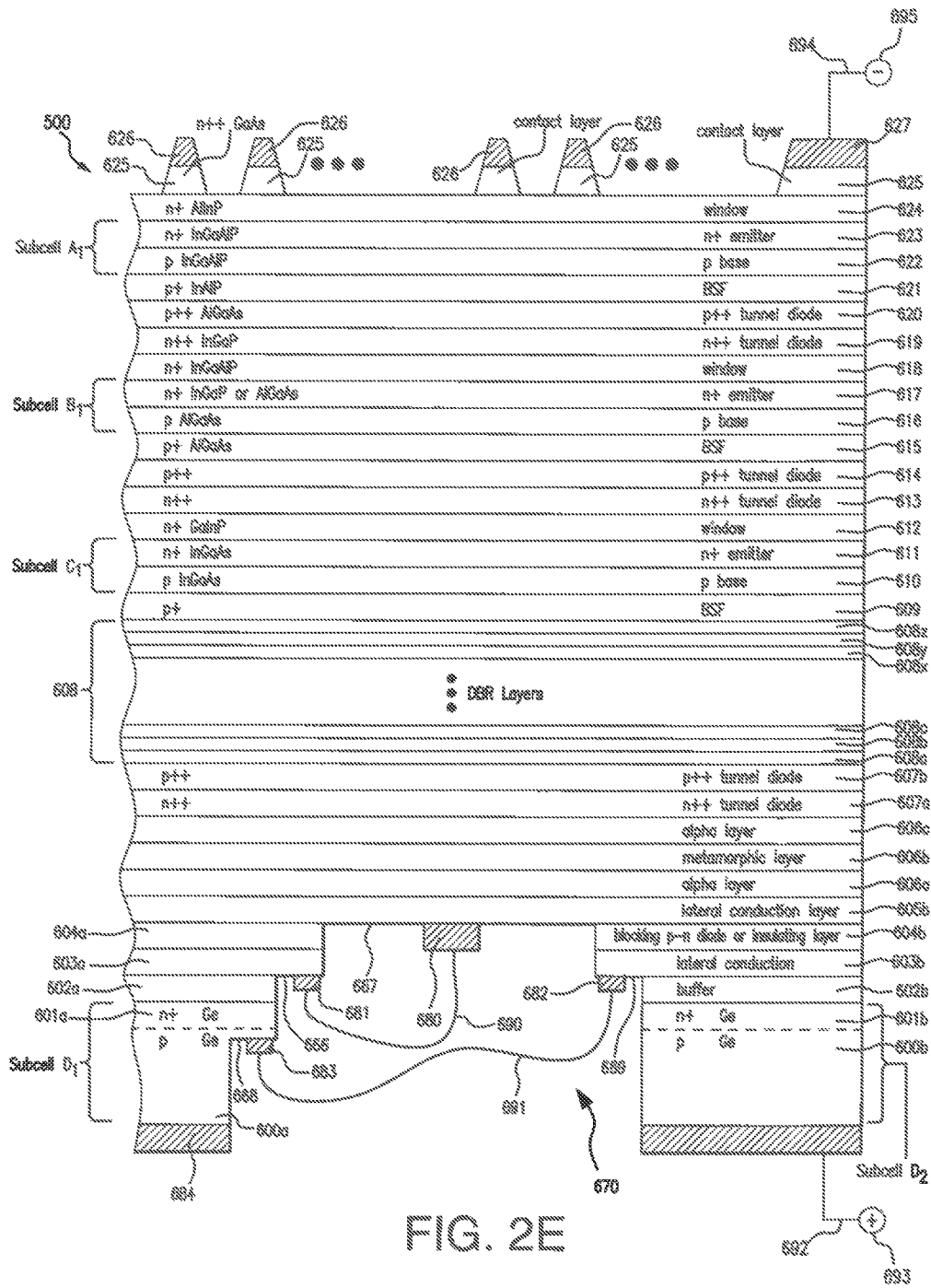
FIG. 2E is a cross-sectional view of the embodiment of FIG. 2D following electrical connection of the first and second semiconductor regions by discrete electrical interconnects according to the present disclosure.

FIG. 2E is a cross-sectional view of the multijunction solar cell subassembly 500 of FIG. 2A after additional stages of fabrication including the deposition of metal contact pads on the ledges depicted in FIG. 2D.

A metal contact pad 680 is deposited on the surface of the ledge of 667 which exposes a portion of the bottom surface of the lateral conduction layer 605b. This pad 680 allows electrical contact to be made to the bottom of the stack of subcells $A_1$ through $C_1$.

A metal contact pad 681 is deposited on the surface of the ledge of 666 which exposes a portion of the bottom surface of the lateral conduction layer 603a. This pad 681 allows electrical contact to be made to the n-polarity terminal of subcell $D_1$.

A metal contact pad 682 is deposited on the surface of the ledge of 669 which exposes a portion of the bottom surface of the lateral conduction layer 603b. This pad 682 allows electrical contact to be made to the n-polarity terminal of subcell $D_2$.

A metal contact pad 683 is deposited on the surface of the ledge of 668 which exposes a portion of the surface of the p-polarity region of subcell $D_1$. Alternatively, contact may be made to a part of the back metal layer 684, which allows electrical contact to be made to the p-terminal of subcell $D_1$.

Figure 3:
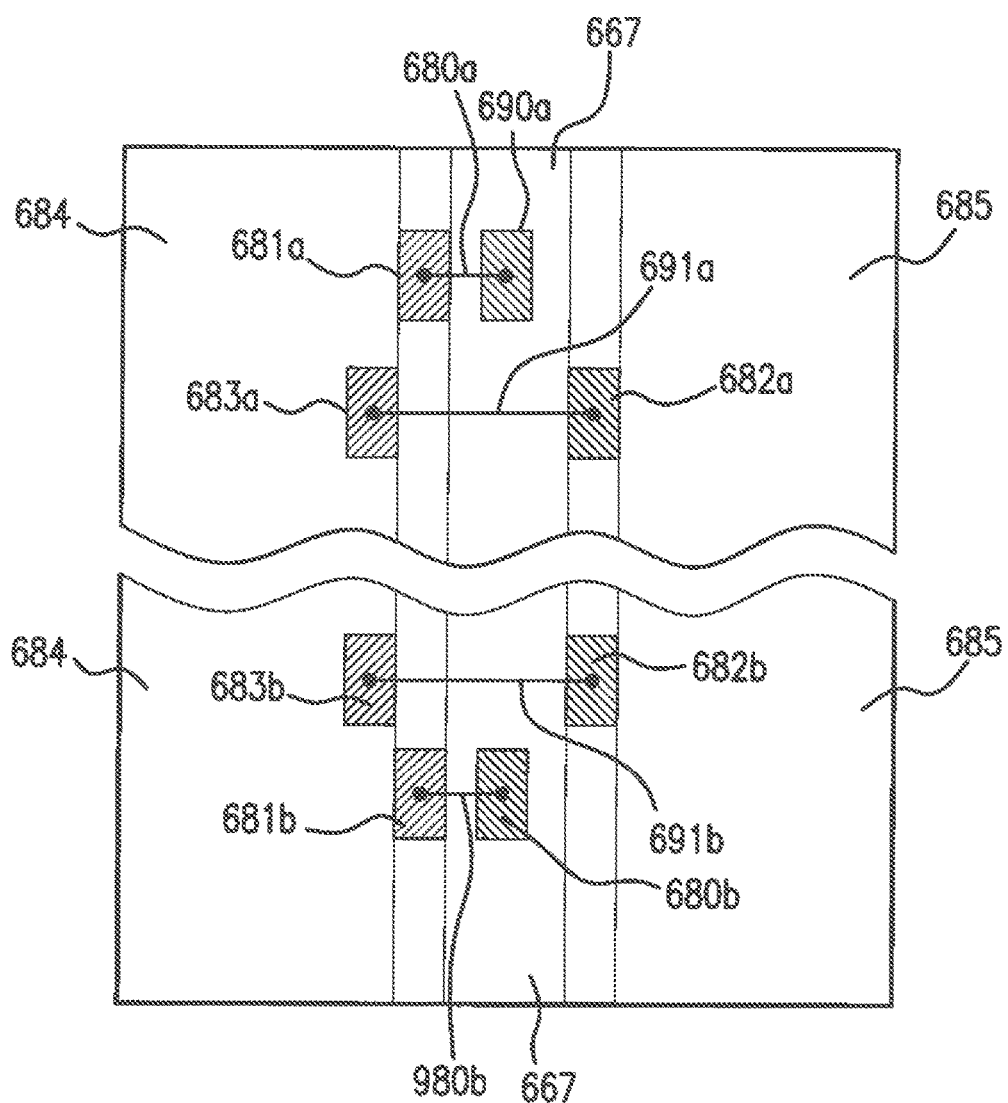
FIG. 3 is a bottom plan view of the solar cell of FIG. 2E depicting the electrical interconnects.

For example, as shown in the bottom plan view depicted in FIG. 3, conductive (e.g., metal) interconnections 690 (i.e., 690a and 690b), and 691 (i.e., 691a and 691b) can be made between different layers of the solar cell subregions. Similarly, the interconnection 691 connects together a contact 683 on the p-region 600a of the solar subcell $D_1$ to a contact 682 on the lateral conduction layer 603b associated with the solar subcell $D_2$. Likewise, the interconnection 690 connects together a contact 681 on the lateral conduction layer 603a associated with the solar subcell $D_1$ to a contact 680 on the lateral conduction layer 605a and 605b.

As noted above, the solar cell assembly includes a first electrical contact of a first polarity and a second electrical contact of a second polarity. In some embodiments, the first electrical contact 695 is connected to the metal contact 627 on the solar cell subassembly 500 by an interconnection 694, and the second electrical contact 693 is connected to the back metal contact of the solar subcell $D_2$ by interconnection 692.

As illustrated in FIG. 3, two or more solar cell subregions 684 and 685 can be connected electrically as described above to obtain a multijunction (e.g. a four-, five- or six-junction) solar cell assembly.

Some implementations provide that at least the base of at least one of the first, second or third solar subcells has a graded doping, i.e., the level of doping varies from one surface to the other throughout the thickness of the base layer. In some embodiments, the gradation in doping is exponential. In some embodiments, the gradation in doping is incremental and monotonic.

In some embodiments, the emitter of at least one of the first, second or third solar subcells also has a graded doping, i.e., the level of doping varies from one surface to the other throughout the thickness of the emitter layer. In some embodiments, the gradation in doping is linear or monotonically decreasing.

Figure 4:
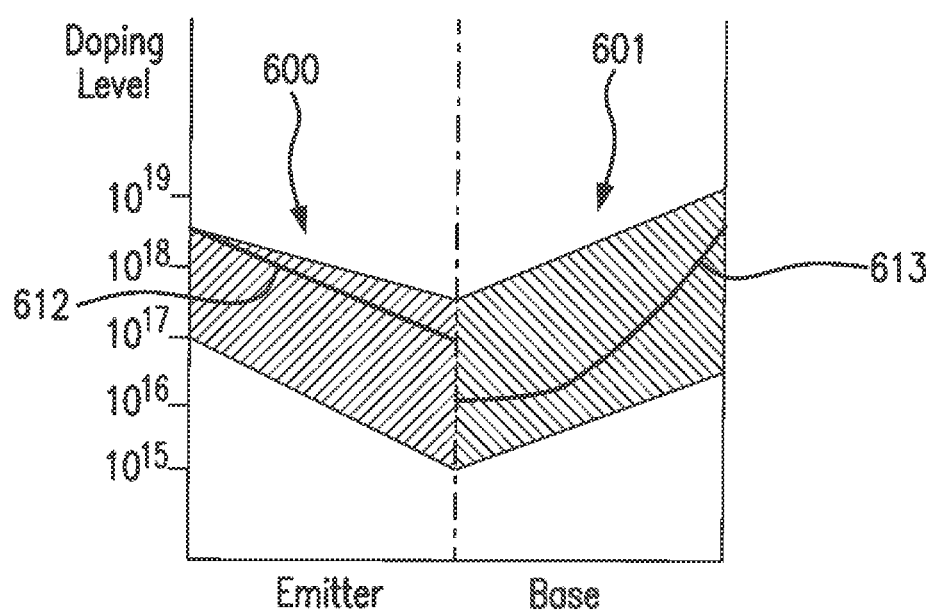
FIG. 4 is a graph of the doping profile in the base and emitter layers of a subcell in the solar cell according to the present disclosure.

As a specific example, the doping profile of the emitter and base layers may be illustrated in FIG. 4, which depicts the amount of doping in the emitter region and the base region of a subcell. N-type dopants include silicon, selenium, sulfur, germanium or tin. P-type dopants include silicon, zinc, chromium, or germanium.

In the example of FIG. 4, in some embodiments, one or more of the subcells have a base region having a gradation in doping that increases from a value in the range of $1\times10^{15}$ to $1\times10^{18}$ free carriers per cubic centimeter adjacent the p-n junction to a value in the range of $1\times10^{16}$ to $4\times10^{18}$ free carriers per cubic centimeter adjacent to the adjoining layer at the rear of the base, and an emitter region having a gradation in doping that decreases from a value in the range of approximately $5\times10^{18}$ to $1\times10^{17}$ free carriers per cubic centimeter in the region immediately adjacent the adjoining layer to a value in the range of $5\times10^{15}$ to $1\times10^{18}$ free carriers per cubic centimeter in the region adjacent to the p-n junction.

Figure 5:
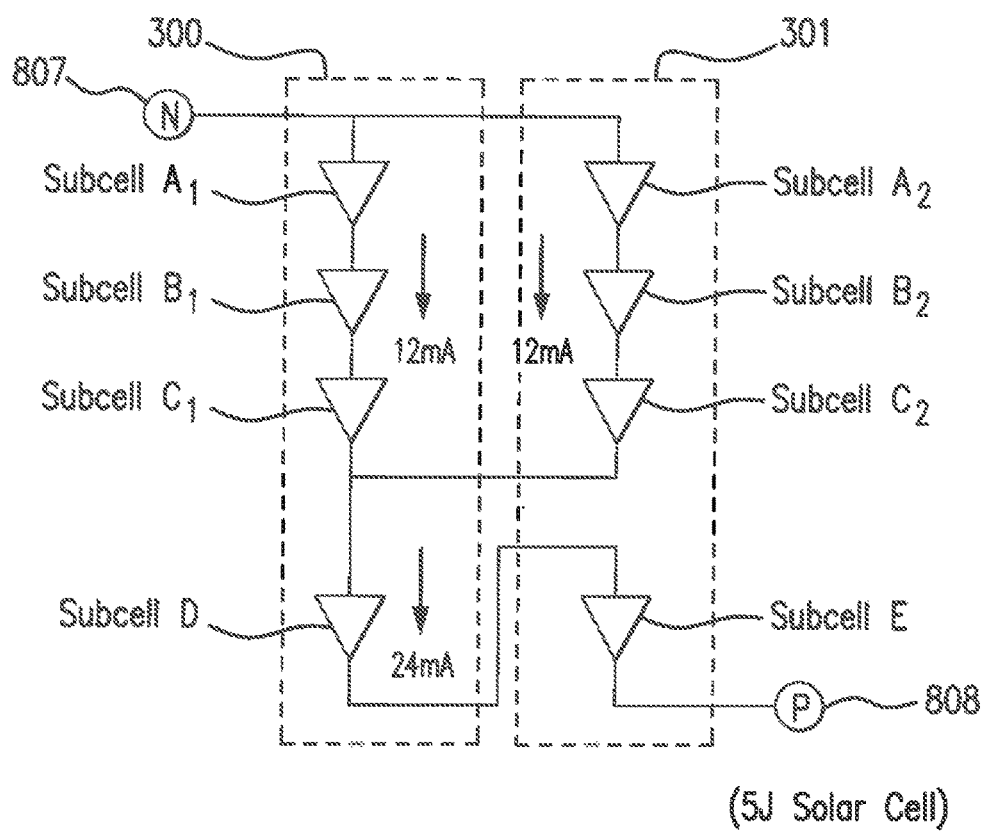
FIG. 5 is a schematic diagram of the five junction solar cell of FIG. 2E.

FIG. 5 is a schematic diagram of the five junction solar cell assembly of FIG. 2E that includes two solar cell semiconductor regions, each of which includes four subcells. The bottom (i.e., fourth) subcell $D_1$ of the left region 684 is connected in a series electrical circuit with the bottom (i.e., fourth) subcell $D_2$ of the right region 685. On the other hand, the upper and middle subcells are connected in parallel with one another (i.e., subcells $A_1$, $B_1$, $C_1$ are connected in parallel with subcells $A_2$, $B_2$, $C_2$).

In some implementations of a five-junction solar cell assembly, such as in the example of FIG. 5, the short circuit density ($J_{sc}$) of the upper first subcells ($A_1$ and $A_2$) and the middle subcells ($B_1$, $B_2$, $C_1$, $C_2$) is about 11 mA/cm$^2$, and the short circuit current density ($J_{sc}$) of the bottom subcells ($D_1$ and $D_2$) is about 22 mA/cm$^2$ or greater. Other implementations may have different values.

The present disclosure like that of the parallel applications, U.S. patent application Ser. Nos. 14/828,206 and 15/213,594, provides a multijunction solar cell that follows a design rule that one should incorporate as many high band gap subcells as possible to achieve the goal to increase the efficiency at high temperature EOL. For example, high band gap subcells may retain a greater percentage of cell voltage as temperature increases, thereby offering lower power loss as temperature increases. As a result, both high temperature beginning-of-life (HT-BOL) and HT-EOL performance of the exemplary multijunction solar cell, according to the present disclosure, may be expected to be greater than traditional cells.

The open circuit voltage ($V_{oc}$) of a compound semiconductor subcell loses approximately 2 mV per degree C. as the temperature rises, so the design rule taught by the present disclosure takes advantage of the fact that a higher band gap (and therefore higher voltage) subcell loses a lower percentage of its $V_{oc}$ with temperature. For example, a subcell that produces a 1.50 volts at 28° C. produces 1.50–42*(0.0023)=1.403 volts at 70° C. which is a 6.4% voltage loss, A cell that produces 0.25 volts at 28° C. produces 0.25–42*(0.0018)=0.174 volts at 70° which is a 30.2% voltage loss.

For example, the cell efficiency (%) measured at room temperature (RT) 28° C. and high temperature (HT) 70° C., at beginning of life (BOL) and end of life (EOL), for a standard three junction commercial solar cell (e.g. a SolAero Technologies Corp. Model ZTJ), such as depicted in FIG. 2 of U.S. patent application Ser. No. 14/828,206, is as follows:

| Condition | Efficiency | |
| --- | --- | --- |
| BOL 28° C. | 29.1% | |
| BOL 70° C. | 26.4% | |
| EOL 70° C. | 23.4% | After 5E14 e/cm² radiation |
| EOL 70° C. | 22.0% | After 1E15 e/cm² radiation |

For the 5J solar cell assembly (comprising two interconnected four-junction subassemblies) described in the present disclosure, the corresponding data is as follows:

| Condition | Efficiency | |
| --- | --- | --- |
| BOL 28° C. | 30.6% | |
| BOL 70° C. | 27.8% | |
| EOL 70° C. | 26.6% | After 5E14 e/cm² radiation |
| EOL 70° C. | 26.1% | After 1E15 e/cm² radiation |

The new solar cell of the present disclosure has a slightly higher cell efficiency than the standard commercial solar cell (ZTJ) at BOL at 70° C. However, more importantly, the solar cell described in the present disclosure exhibits substantially improved cell efficiency (%) over the standard commercial solar cell (ZTJ) at 1 MeV electron equivalent fluence of $5 \times 10^{14}$ e/cm², and dramatically improved cell efficiency (%) over the standard commercial solar cell (ZTJ) at 1 MeV electron equivalent fluence of $1 \times 10^{15}$ e/cm².

The selected radiation exposure levels noted above are meant to simulate the environmental conditions of typical satellites in earth orbit. A low earth orbit (LEO) satellite will typically experience radiation equivalent to $5 \times 10^{14}$ e/cm² over a five year lifetime. A geosynchronous earth orbit (GEO) satellite will typically experience radiation in the range of $5 \times 10^{14}$ e/cm² to $1 \times 10$ e/cm² over a fifteen year lifetime.

The wide range of electron and proton energies present in the space environment necessitates a method of describing the effects of various types of radiation in terms of a radiation environment which can be produced under laboratory conditions. The methods for estimating solar cell degradation in space are based on the techniques described by Brown et al. [Brown, W. L., J. D. Gabbe, and W. Rosenzweig, Results of the Telstar Radiation Experiments, Bell System Technical J., 42, 1505, 1963] and Tada [Tada, H. Y., J. R. Carter, Jr., B. E. Anspaugh, and R. G. Downing, Solar Cell Radiation Handbook, Third Edition, JPL Publication 82-69, 1982]. In summary, the omnidirectional space radiation is converted to a damage equivalent unidirectional fluence at a normalised energy and in terms of a specific radiation particle. This equivalent fluence will produce the same damage as that produced by omnidirectional space radiation considered when the relative damage coefficient (RDC) is properly defined to allow the conversion. The relative damage coefficients (RDCs) of a particular solar cell structure are measured a priori under many energy and fluence levels. When the equivalent fluence is determined for a given space environment, the parameter degradation can be evaluated in the laboratory by irradiating the solar cell with the calculated fluence level of unidirectional normally incident flux. The equivalent fluence is normally expressed in terms of 1 MeV electrons or 10 MeV protons.

The software package Spenvis (www.spenvis.oma.be) is used to calculate the specific electron and proton fluence that a solar cell is exposed to during a specific satellite mission as defined by the duration, altitude, azimuth, etc. Spenvis employs the EQFLUX program, developed by the Jet Propulsion Laboratory (JPL) to calculate 1 MeV and 10 MeV damage equivalent electron and proton fluences, respectively, for exposure to the fluences predicted by the trapped radiation and solar proton models for a specified mission environment duration. The conversion to damage equivalent fluences is based on the relative damage coefficients determined for multijunction cells [Marvin, D. C., Assessment of Multijunction Solar Cell Performance in Radiation Environments, Aerospace Report No. TOR-2000 (1210)-1, 2000]. A widely accepted total mission equivalent fluence for a geosynchronous satellite mission of 15 year duration is 1 MeV $1 \times 10^{15}$ electrons/cm².

The exemplary solar cell described herein may require the use of aluminum in the semiconductor composition of each of the top two subcells. Aluminum incorporation is widely known in the III-V compound semiconductor industry to degrade BOL subcell performance due to deep level donor defects, higher doping compensation, shorter minority carrier lifetimes, and lower cell voltage and an increased BOL $E_g/q - V_{oc}$ metric. However, consideration of the EOL $E_g/q - V_{oc}$ metric, or more generally, total power output over a defined predetermined operational life, in the present disclosure presents a different approach. In short, increased BOL $E_g/q - V_{oc}$ may be the most problematic shortcoming of aluminum containing subcells; the other limitations can be mitigated by modifying the doping schedule or thinning base thicknesses.

It will be understood that each of the elements described above, or two or more together, also may find a useful application in other types of structures or constructions differing from the types of structures or constructions described above.

Although described embodiments of the present disclosure utilizes a vertical tandem stack of four subcells, various aspects and features of the present disclosure can apply to tandem stacks with fewer or greater number of subcells, i.e. two junction cells, three junction cells, five junction cells, etc.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n+ type InGaAlP is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, GaP, InP, GaSb, AlSb, InAs, InSb, ZnSe, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, GaInNAsSb, GaNAsSb, GaNAsInBi, GaNAsSbBi, GaNAsInBiSb, AlGaInNAs, ZnSSe, CdSSe, SiGe, SiGeSn, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A multijunction solar cell including a terminal of first polarity and a terminal of second polarity comprising:
   first and second semiconductor regions formed from a single monolithic semiconductor body, each region including substantially identical tandem vertical stacks of at least an upper first solar subcell, a bottom second solar subcell, wherein the second semiconductor region is disposed adjacent to and with respect to the incoming illumination, parallel to the first semiconductor region,
   wherein the upper first solar subcells of the first and second semiconductor regions are each contiguous and composed of the same semiconductor material;
   wherein the bottom second solar subcells are composed of layers of the same semiconductor material, but are not contiguous and are spatially separated by an opening in the first and second semiconductor regions, such that the layers of the bottom second solar subcells are electrically isolated;
   a bottom electrode electrically connected to the bottom second solar subcell of the second semiconductor region, the bottom electrode electrically connected to a terminal of second polarity;
   a top electrode on the upper first solar subcells, the top electrode electrically connected to a terminal of first polarity; and
   an electrical interconnect connecting the bottom second solar subcell of the first semiconductor region in a series electrical circuit with the bottom second solar subcell of the second semiconductor region so that at least a three junction solar cell is formed by the electrically interconnected semiconductor regions.

2. A multijunction solar cell having a terminal of a first polarity and a terminal of a second polarity, the multijunction solar cell comprising a semiconductor body including:
   (a) a first semiconductor region including:
      an upper first solar subcell ($a_1$) composed of a semiconductor material having a first band gap;
      a second solar subcell ($b_1$) adjacent to said upper first solar subcell ($a_1$) and composed of a semiconductor material having a second band gap smaller than the first band gap and being lattice matched with the upper first solar subcell ($a_1$);
      a third solar subcell ($c_1$) adjacent to said second solar subcell ($b_1$) and composed of a semiconductor material having a third band gap smaller than the second band gap and being lattice matched with the second solar subcell ($b_1$);
      an interlayer ($i_1$) adjacent to said third solar subcell ($c_1$), said interlayer ($i_1$) having a fourth band gap or band gaps greater than said third band gap; and
      a fourth solar subcell ($d_1$) adjacent to said interlayer ($i_1$) and composed of a semiconductor material having a fifth band gap smaller than the fourth band gap and being lattice mismatched with the third solar subcell ($c_1$), and including a first electrode ($e_1$) electrically coupled to a top surface of the fourth solar subcell ($d_1$), and a second electrode ($f_1$) in electrical contact with a base-emitter layer of the fourth solar subcell ($d_1$);
   (b) a second semiconductor region disposed adjacent and parallel to the first semiconductor region and including:
      an upper first solar subcell ($a_2$) composed of a semiconductor material having the first band gap;
      a second solar subcell ($b_2$) adjacent to said upper first solar subcell ($a_2$) and composed of a semiconductor material having the second band gap smaller than the first band gap and being lattice matched with the upper first solar subcell ($a_2$);
      a third solar subcell ($c_2$) adjacent to said second solar subcell ($b_2$) and composed of a semiconductor material having the third band gap smaller than the second band gap and being lattice matched with the second solar subcell ($b_2$);

an interlayer ($i_2$) adjacent to said third solar subcell ($c_2$), said interlayer ($i_2$) having the fourth band gap greater than said third band gap; and a fourth solar subcell ($d_2$) adjacent to said interlayer ($i_2$) and composed of a semiconductor material having the fifth band gap smaller than the fourth band gap and being lattice matched with the third solar subcell ($c_2$), and including a first electrode ($e_2$) electrically coupled to a top surface of the fourth solar subcell ($d_2$), and a second electrode ($f_2$) in electrical contact with the bottom surface of the fourth solar subcell ($d_2$) connected to a terminal of a second polarity;

(c) a first opening in the first and second semiconductor regions providing a spatial separation between the fourth solar subcells ($d_1$) and ($d_2$);

(d) a first highly doped semiconductor conduction layer adjacent to the third solar subcells ($c_1$) and ($c_2$) having a bottom electrode extending from the first highly doped semiconductor conduction layer into the first opening between the fourth solar subcells ($d_1$) and ($d_2$), the bottom electrode not directly contacting either of the fourth solar subcells ($d_1$) and ($d_2$); and (e) wherein the upper first solar subcells ($a_1$) and ($a_2$) include a top electrode that is electrically coupled with a terminal of first polarity;

wherein the upper first solar subcells ($a_1$) and ($a_2$), second solar subcells ($b_1$) and ($b_2$), and third solar subcells ($c_1$) and ($c_2$) are each, respectfully, contiguous and composed of the same semiconductor material;

wherein the fourth solar subcells ($d_1$) and ($d_2$) are composed of layers of the same semiconductor material, but are not contiguous and are spatially separated with the first opening between them, such that the layers are electrically isolated;

wherein the first electrode ($e_1$) electrically coupled to the top surface of the fourth solar subcell ($d_1$) of the first semiconductor region is electrically coupled with the bottom electrode of the first highly doped semiconductor conduction layer; and wherein the second electrode ($f_1$) electrically coupled to the bottom surface of the fourth solar subcell ($d_1$) is electrically coupled with the first electrode ($e_2$) that is electrically coupled to the top surface of the fourth solar subcell ($d_2$) so as to form a five junction solar cell.

3. A multijunction solar cell as defined in claim 2, wherein the fifth band gap is approximately 0.67 eV, the third band gap is in the range of approximately 1.41 eV and 1.31 eV, the second band gap is in the range of approximately 1.65 to 1.8 eV and the first band gap is in the range of 2.0 to 2.20 eV.

4. A multijunction solar cell as defined in claim 2, wherein the fourth band gap or band gaps of the interlayers ($i_1$) and ($i_2$) is in the range of 1.41 eV to 1.6 eV throughout its thickness.

5. A multijunction solar cell as defined in claim 2, further comprising:

a distributed Bragg reflector (DBR) adjacent to and between the third solar subcells ($c_1$) and ($c_2$) and the fourth solar subcells ($d_1$) and ($d_2$) and arranged so that light can enter and pass through the third solar subcells ($c_1$) and ($c_2$) and at least a portion of which can be reflected back into the third solar subcells ($c_1$) and ($c_2$) by the DBR, and the DBR is composed of a plurality of alternating layers of lattice matched materials with discontinuities in their respective indices of refraction and the difference in refractive indices between alternating layers is maximized in order to minimize the number of periods required to achieve a given reflectivity, and the thickness and refractive index of each period determines the stop band and its limiting wavelength, and wherein the plurality of alternating layers includes a first DBR layer composed of a plurality of p type $Al_xGa_{1-x}$(In)As layers, and a second DBR layer disposed over the first DBR layer and composed of a plurality of n type or p type $Al_yGa_{1-x}$(In)As layers, where $0<x<1$, $0<y<1$, and y is greater than x, and (In) designates that indium is an optional constituent.

6. A multijunction solar cell as defined in claim 2, wherein the respective selection of the composition, band gaps, open circuit voltage, and short circuit current of each of the subcells (i) maximizes the efficiency of the assembly at high temperature in the range of 40 to 100 degrees Centigrade in deployment in space at a predetermined time after the initial deployment (referred to as the "beginning of life" or BOL), such predetermined time being referred to as the "end-of-life" (EOL), wherein such predetermined time is in the range of one to twenty-five years; or (ii) maximizes the efficiency of the solar cell at a predetermined low intensity less than 0.1 suns and low temperature value less than minus 80 degrees Centigrade in deployment in space at a predetermined time after the initial deployment in space, or the "beginning of life" (BOL), such predetermined time being referred to as the "end-of-life" (EOL) time, and being at least one year.

7. A multijunction solar cell as defined in claim 2, wherein the upper first solar subcells ($a_1$) and ($a_2$) comprise aluminum in an amount of at least 10% by mole fraction.

8. A multijunction solar cell as defined in claim 2, wherein the fourth solar subcells ($d_1$) and ($d_2$) comprise a base region and a base emitter junction, wherein the short circuit density ($J_{sc}$) of the fourth solar subcells ($d_1$) and ($d_2$) is at least three times that of the upper first solar subcells ($a_1$) and ($a_2$), second solar subcells ($b_1$) and ($b_2$), and third solar subcells ($c_1$) and ($c_2$), with the base region of the fourth solar subcells ($d_1$) and ($d_2$) having a gradation in doping that increases from the base emitter junction to a bottom of the base region in the range of $1\times10^{15}$ to $5\times10^{18}$ per cubic centimeter.

9. A multijunction solar cell as defined in claim 2, wherein the fifth band gap is approximately 0.67 eV, the third band gap is in the range of approximately 1.41 eV and 1.31 eV, the second band gap is in the range of approximately 1.65 to 1.8 eV and the first band gap is in the range of 2.0 to 2.20 eV; and wherein the upper first subcells ($a_1$) and ($a_2$) are composed of indium gallium aluminum phosphide;

the second solar subcells ($b_1$) and ($b_2$) include an emitter layer composed of indium gallium phosphide or aluminum gallium arsenide, and a base layer composed of aluminum gallium arsenide or indium gallium arsenide phosphide;

the third solar subcells ($c_1$) and ($c_2$) are composed of indium gallium arsenide; and the fourth subcells ($d_1$) and ($d_2$) are composed of germanium.

10. A multijunction solar cell as defined in claim 2, wherein the interlayers ($i_1$) and ($i_2$) are compositionally graded to substantially lattice match the third solar subcells ($c_1$) and ($c_2$) on one side and the lower fourth solar subcells ($d_1$) and ($d_2$) on the other side, and are composed of any of the As, P, N, Sb based III-V compound semiconductors subject to the constraints of having the in-plane lattice parameter less than or equal to that of the third solar subcells ($c_1$) and ($c_2$) and greater than or equal to that of the lower fourth solar subcells ($d_1$) and ($d_2$).

11. A multijunction solar cell as defined in claim 10, wherein the third band gap is approximately 1.37 eV, the second band gap is approximately 1.73 eV and the first band gap is approximately 2.10 eV.

12. A multijunction solar cell as defined in claim 2, wherein:
   the upper first subcells ($a_1$) and ($a_2$) are composed of indium gallium aluminum phosphide;
   the second solar subcells ($b_1$) and ($b_2$) include an emitter layer composed of indium gallium phosphide or aluminum gallium arsenide, and a base layer composed of aluminum gallium arsenide or indium gallium arsenide phosphide;
   the third solar subcells ($c_1$) and ($c_2$) are composed of indium gallium arsenide;
   the fourth subcells ($d_1$) and ($d_2$) are composed of germanium or InGaAs, GaSb, GaAsSb, InAsP, InAlAs, SiGeSn, InGaAsN, InGaAsNSb, InGaAsNBi, InGaAsNSbBi, InGaSbN, InGaBiN, or InGaSbBiN; and
   the interlayers ($i_1$) and ($i_2$) are composed of (Al)In$_x$Ga$_{1-x}$As or In$_x$Ga$_{1-x}$P with $0<x<1$, and (Al) designates that aluminum is an optional constituent.

13. A multijunction solar cell as defined in claim 12, wherein the short circuit current density ($J_{sc}$) of the first subcells ($a_1$) and ($a_2$), second subcells ($b_1$) and ($b_2$), and third subcells ($c_1$) and ($c_2$) are approximately 11 mA/cm$^2$, and the short circuit current density ($J_{sc}$) of the fourth subcells ($d_1$) and ($d_2$) is approximately 34 mA/cm$^2$.

14. A multijunction solar cell as defined in claim 2, wherein the first and second semiconductor regions further comprise a blocking p-n diode or insulating layer disposed adjacent to and below the first highly doped lateral conduction layer.

15. A multijunction solar cell as defined in claim 14, further comprising a second highly doped lateral conduction layer disposed adjacent to and below the blocking p-n diode or insulating layer, wherein the first opening divides the second highly doped lateral conduction layer, wherein the first electrode ($e_1$) of the fourth solar subcell ($d_1$) of the first semiconductor region is in electrical contact with the second highly doped lateral conduction layer, and wherein the first electrode ($e_2$) of the fourth solar subcell (d2) of the second semiconductor region is in electrical contact with the second highly doped lateral conduction layer.

16. A multijunction solar cell as defined in claim 14, further comprising a first alpha layer disposed above the first lateral conduction layer and having a different composition from the first lateral conduction layer and a thickness of between 0.25 and 1.0 microns and functioning to prevent threading dislocations from propagating, either opposite to the direction of growth or in the direction of growth into the third subcells (c2) and (c2).

17. A multijunction solar cell as defined in claim 16, wherein the fourth solar subcells ($d_1$) and ($d_2$) each comprise n+ type and p-type semiconductor material, the multijunction solar cell further comprising:
   a second opening in the first semiconductor region extending from the bottom surface of the first semiconductor region to the second lateral conduction layer; and
   a third opening in the first semiconductor region extending from the bottom surface of the first semiconductor region to the p-type semiconductor material of the fourth subcell ($d_1$).

18. A multijunction solar cell as defined in claim 17 wherein the first electrode ($e_1$) electrically connected to the top surface of the fourth solar subcell ($d_1$) comprises a second metallic contact pad in contact with the second lateral conduction layer; and
   wherein a first electrical interconnect connects the first electrode electrically ($e_1$) connected to the top surface of the fourth solar subcell ($d_1$) and the bottom electrode of the first highly doped semiconductor conduction layer.

19. A multijunction solar cell as defined in claim 18 wherein a second electrical interconnect connects the second electrode ($f_1$) in electrical connection with the top surface of the forth solar cell ($d_1$) of the first semiconductor region with the first electrode ($e_2$) in electrical contact with the top surface of the fourth solar subcell ($d_2$) of the second semiconductor region.

* * * * *